United States Patent
Lee et al.

(10) Patent No.: US 11,205,484 B2
(45) Date of Patent: Dec. 21, 2021

(54) NON-VOLATILE MEMORY DEVICE AND OPERATION METHOD OF THE SAME

(71) Applicant: SAMSUNG ELECTRONICS CO., LTD., Suwon-si (KR)

(72) Inventors: Soo-Woong Lee, Seoul (KR); Hyun-Jin Kim, Hwaseong-si (KR); Jae-Yong Jeong, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 26 days.

(21) Appl. No.: 16/752,924

(22) Filed: Jan. 27, 2020

(65) Prior Publication Data
US 2020/0258577 A1    Aug. 13, 2020

(30) Foreign Application Priority Data
Feb. 11, 2019    (KR) .................. 10-2019-0015557

(51) Int. Cl.
| | | |
|---|---|---|
| G11C 7/10 | (2006.01) | |
| G11C 16/10 | (2006.01) | |
| G11C 16/26 | (2006.01) | |
| G11C 16/08 | (2006.01) | |
| G11C 16/32 | (2006.01) | |
| G11C 16/24 | (2006.01) | |

(52) U.S. Cl.
CPC ............. *G11C 16/10* (2013.01); *G11C 16/08* (2013.01); *G11C 16/24* (2013.01); *G11C 16/26* (2013.01); *G11C 16/32* (2013.01); *G11C 2211/5642* (2013.01)

(58) Field of Classification Search
CPC ......... G11C 16/10; G11C 16/08; G11C 16/24; G11C 16/26; G11C 16/32; G11C 2211/5642
USPC .................................................... 365/189.05
See application file for complete search history.

(56) References Cited

U.S. PATENT DOCUMENTS

| | | | |
|---|---|---|---|
| 7,164,605 B2 | 1/2007 | Kawai et al. | |
| 8,036,041 B2 | 10/2011 | Li | |
| 8,472,268 B2 | 6/2013 | Hosono et al. | |
| 9,349,482 B2* | 5/2016 | Kim | G11C 16/3459 |
| 9,466,390 B2* | 10/2016 | Kim | G11C 16/3404 |
| 9,552,882 B2 | 1/2017 | Tseng et al. | |
| 9,685,237 B2* | 6/2017 | Park | G11C 13/0028 |
| 9,842,654 B2* | 12/2017 | Lee | G11C 11/5642 |
| 9,870,833 B2* | 1/2018 | Lim | G11C 16/26 |
| 9,887,009 B2 | 2/2018 | Chen et al. | |

(Continued)

*Primary Examiner* — Viet Q Nguyen
(74) *Attorney, Agent, or Firm* — F. Chau & Associates, LLC

(57) ABSTRACT

A non-volatile memory device includes a memory cell array including a plurality of memory cells, a page buffer circuit, and a control logic circuit. The page buffer circuit includes a plurality of first page buffers and a plurality of second page buffers, each including a sense latch, a data latch, and a cache latch. The sense latch senses data stored in the memory cell array and dumps the sensed data to the data latch, the data latch dumps the data dumped by the sense latch to the cache latch, and the cache latch transmits the data dumped by the data latch to a data I/O circuit. While the cache latch included in at least one of the plurality of first page buffers is performing a data transmit operation, the data latch included in at least one of the plurality of second page buffers performs a data dumping operation.

18 Claims, 28 Drawing Sheets

(56) References Cited

U.S. PATENT DOCUMENTS

| | | | |
|---|---|---|---|
| 9,947,394 B2* | 4/2018 | Yoon | G11C 16/08 |
| 10,007,603 B2* | 6/2018 | Lee | G11C 16/32 |
| 10,332,607 B2* | 6/2019 | Choi | G11C 16/08 |
| 10,490,285 B2* | 11/2019 | Yoon | G11C 11/5642 |
| 10,658,040 B2* | 5/2020 | Lim | G11C 16/0483 |
| 10,699,788 B2* | 6/2020 | Lee | G11C 16/24 |
| 2015/0039809 A1* | 2/2015 | Kim | G11C 16/10 711/103 |
| 2015/0332777 A1* | 11/2015 | Yoon | G11C 16/0466 714/764 |
| 2015/0378887 A1* | 12/2015 | Lee | G11C 7/1039 711/103 |
| 2016/0011779 A1 | 1/2016 | Lee | |
| 2016/0071581 A1 | 3/2016 | Lee | |
| 2017/0075629 A1 | 3/2017 | Manohar et al. | |
| 2018/0137912 A1 | 5/2018 | Oh et al. | |

* cited by examiner

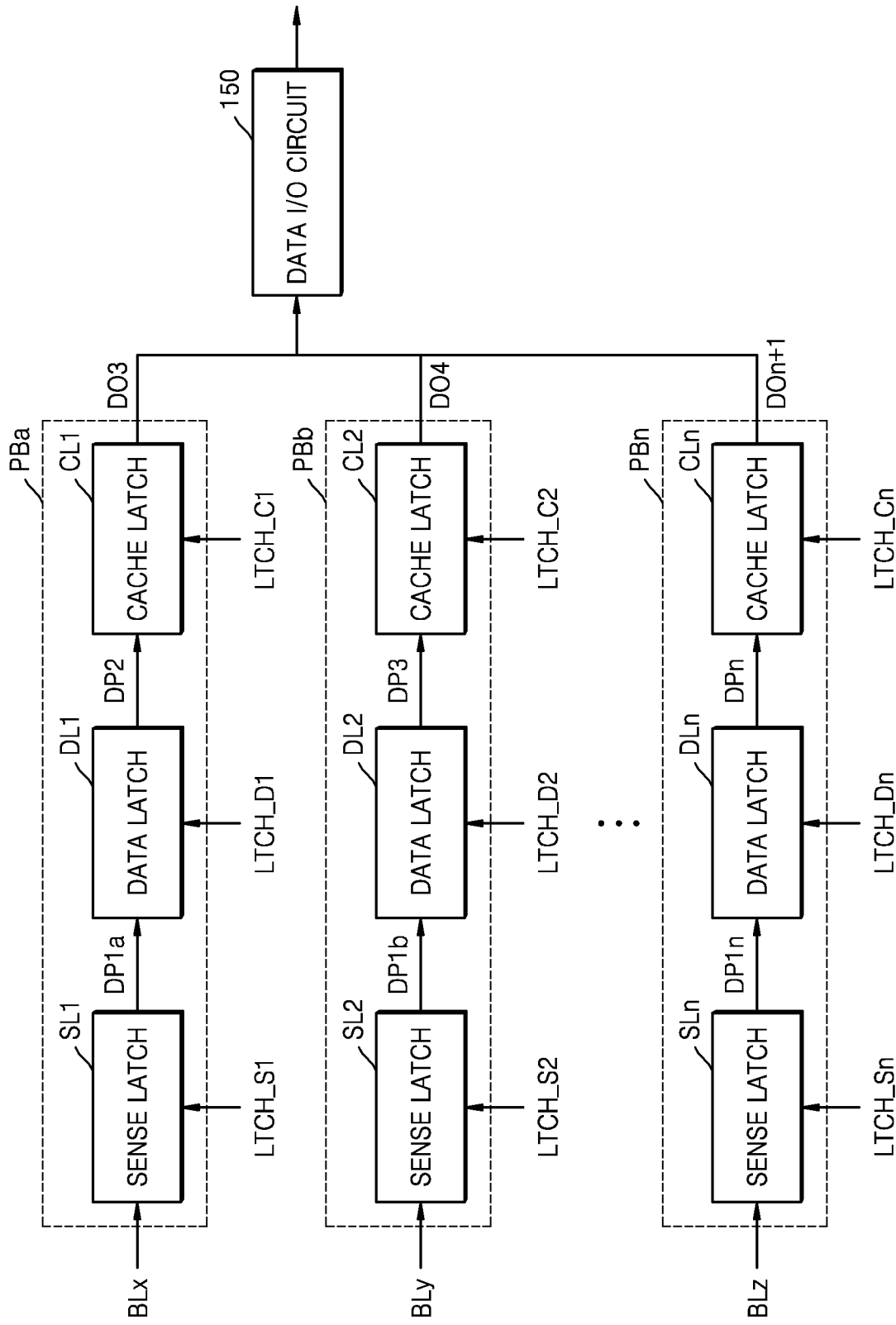

NON-VOLATILE MEMORY DEVICE AND OPERATION METHOD OF THE SAME

CROSS-REFERENCE TO RELATED APPLICATION

This application claims priority under 35 U.S.C. § 119 to Korean Patent Application No. 10-2019-0015557, filed on Feb. 11, 2019 in the Korean Intellectual Property Office, the disclosure of which is incorporated by reference herein in its entirety.

TECHNICAL FIELD

Exemplary embodiments of the inventive concept relate to non-volatile memory devices and methods of operating the same, and more particularly, to a non-volatile memory device including a page buffer that senses and reads data of a memory cell, and a method of operating the non-volatile memory device.

DISCUSSION OF RELATED ART

Semiconductor memory devices are storage devices that are implemented using a semiconductor, such as silicon (Si), germanium (Ge), gallium arsenide (GaAs), or indium phosphide (InP). Semiconductor memory devices may be broadly classified into volatile memory devices and non-volatile memory devices.

Non-volatile memory devices are memory devices capable of retaining stored information even when power is cut off. Examples of non-volatile memory devices include read-only memory (ROM), programmable read-only memory (PROM), erasable programmable read-only memory (EPROM), electrically erasable programmable read-only memory (EEPROM), flash memory, phase-change random-access memory (PRAM), magnetoresistive random-access memory (MRAM), resistive random-access memory (RRAM), and ferroelectric random-access memory (FRAM). Flash memory devices may be broadly classified into NOR flash and NAND flash.

SUMMARY

According to an exemplary embodiment of the inventive concept, a non-volatile memory device includes a memory cell array including a plurality of memory cells, a page buffer circuit, and a control logic circuit. The page buffer circuit includes a plurality of first page buffers and a plurality of second page buffers, the plurality of first page buffers and the plurality of second page buffers each including a sense latch, a data latch, and a cache latch. The sense latch senses data stored in the memory cell array and dumps the sensed data to the data latch, the data latch dumps the data dumped by the sense latch to the cache latch, and the cache latch transmits the data dumped by the data latch to a data input/output (I/O) circuit. The control logic circuit is configured to control the page buffer circuit such that, while the cache latch included in at least one of the plurality of first page buffers is performing a data transmit operation, the data latch included in at least one of the plurality of second page buffers performs a data dumping operation.

According to an exemplary embodiment of the inventive concept, a non-volatile memory device configured to perform a random read operation includes a memory cell array including a page including memory cells connected to an identical word line, a page buffer circuit, and a control logic circuit. The page buffer circuit includes a first page buffer and a second page buffer, the first page buffer and the second page buffer each including a sense latch, a data latch, and a cache latch. The sense latch senses data from the memory cell array and dumps the sensed data, the data latch selectively dumps the data dumped by the sense latch, and the cache latch transmits the data dumped by the data latch to a data input/output (I/O) circuit. The control logic unit is configured to control the data latch of the first page buffer to dump first data to the cache latch of the first page buffer and control the data latch of the second page buffer not to dump second data to the cache latch of the second page buffer, in response to receiving a command and an address indicating the random read operation.

According to an exemplary embodiment of the inventive concept, an operation method of a page buffer circuit that outputs data sensed from a plurality of bit lines to a data input/output (I/O) circuit includes sensing first data and second data from the plurality of bit lines by using a plurality of first sense latches and a plurality of second sense latches, respectively, dumping the first data from the plurality of first sense latches to a plurality of first data latches, and dumping the second data from the plurality of second sense latches to a plurality of second data latches, dumping the first data from the plurality of first data latches to a plurality of first cache latches, and maintaining the second data without dumping the second data during at least a portion of a time period during which the first data is being dumped to the plurality of first cache latches, where the maintaining of the second data is performed by the plurality of second data latches.

BRIEF DESCRIPTION OF THE DRAWINGS

The above and other features of the inventive concept will be more clearly understood by describing in detail exemplary embodiments thereof with reference to the accompanying drawings.

FIG. 15B is a block diagram for explaining page buffers included in the page buffer circuit of FIG. 15A according to an exemplary embodiment of the inventive concept.

DETAILED DESCRIPTION OF THE EMBODIMENTS

Figure 1:
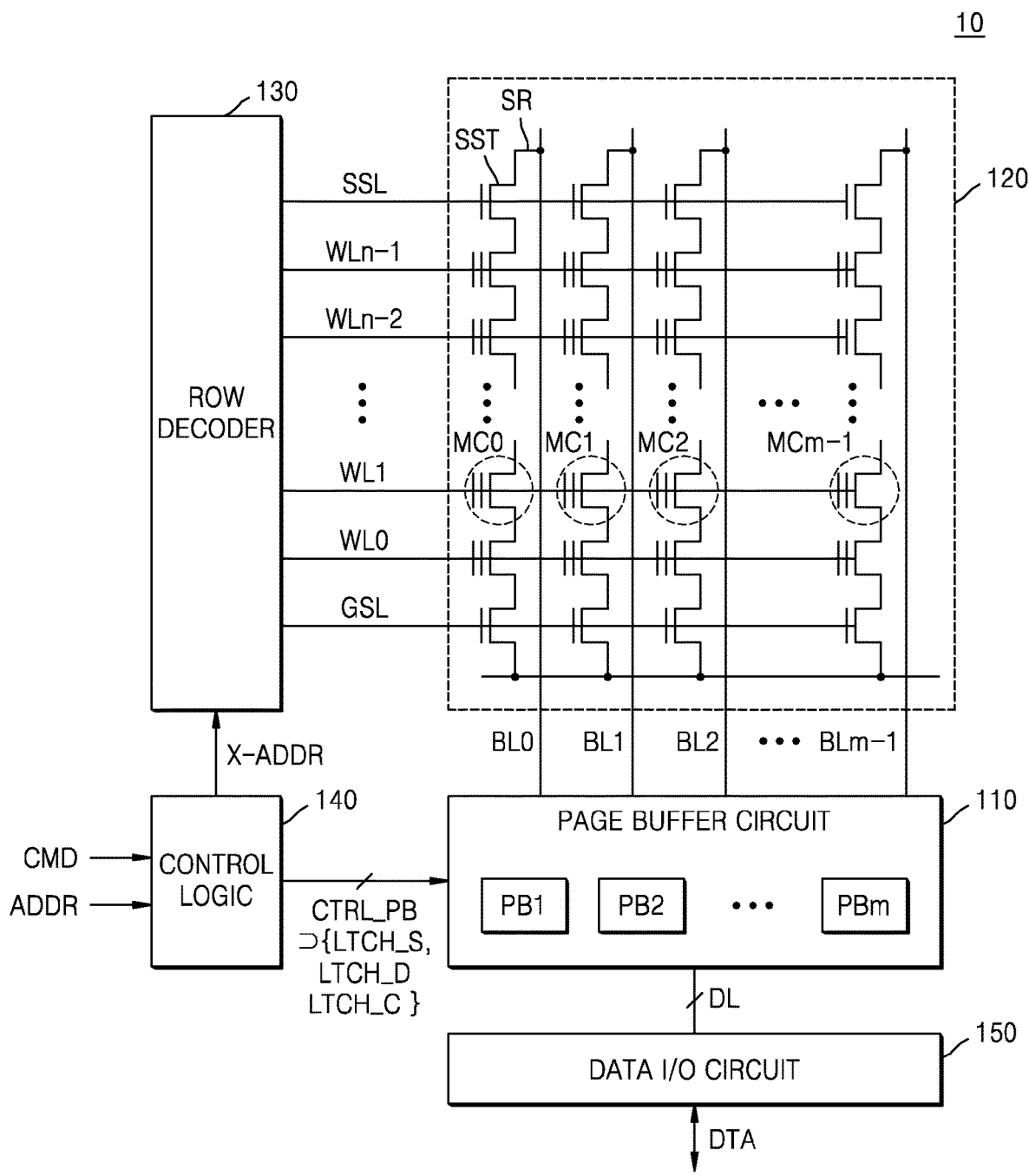
FIG. 1 is a block diagram of a non-volatile memory device according to an exemplary embodiment of the inventive concept.

Exemplary embodiments of the inventive concept provide advancement of a next sensing time point while reading data from a memory cell via a page buffer of a non-volatile memory device, and reduction of a time period from a sensing time point to a data-outputting time point.

Hereinafter, exemplary embodiments of the inventive concept will be described more fully with reference to the accompanying drawings. Like reference numerals may refer to like elements throughout this application.

FIG. 1 is a block diagram of a non-volatile memory device according to an exemplary embodiment of the inventive concept.

Referring to FIG. 1, a non-volatile memory device 10 may include a page buffer circuit 110 including a plurality of page buffers PB1 through PBm, a memory cell array 120 including a plurality of memory cells MC0 through MCm-1, a row decoder 130, and a control logic unit 140. The control logic unit 140 may also be referred to as a control logic circuit. Although the non-volatile memory device 10 is illustrated as being flash memory, the inventive concept is not limited to flash memory, and is applicable to all types of non-volatile memory devices (for example, read only memory (ROM), programmable ROM (PROM), electrically erasable and programmable ROM (EEPROM), flash memory, phase-change random access memory (PRAM), magnetic RAM (MRAM), resistive RAM (RRAM), and ferroelectric RAM (FRAM)).

The page buffer circuit 110 may operate as a write driver or a sense amplifier according to an operation mode. During a program operation, the page buffer circuit 110 may transmit a bit line voltage corresponding to data that is to be programmed to a bit line BL of the memory cell array 120. During a read operation including a sequential read operation and a random read operation, the page buffer circuit 110 may sense data stored in a selected memory cell via the bit line BL. The page buffer circuit 110 may latch the sensed data and output the latched data to the outside.

Each of the plurality of page buffers PB1 through PBm included in the page buffer circuit 110 may include a sense latch, a data latch, and a cache latch. This will be described later with reference to FIG. 2B and the like. For convenience of explanation, some of the plurality of page buffers PB1 through PBm are referred to as first page buffers, and some others of the plurality of page buffers PB1 through PBm are referred to as second page buffers. This will be described later with reference to FIG. 2A and the like.

The memory cell array 120 may be connected to the row decoder 130 via word lines WL0 through WLn-1, a cell string select line SSL, and a ground select line GSL. The memory cell array 120 may be connected to the page buffer circuit 110 via bit lines BL0 through BLm-1. The memory cell array 120 may include a plurality of NAND cell strings SR. Each NAND cell string SR may be connected to the bit line BL (e.g., one of the bit lines BL0 through BLm-1) via a cell string select transistor SST.

Figure 2A:
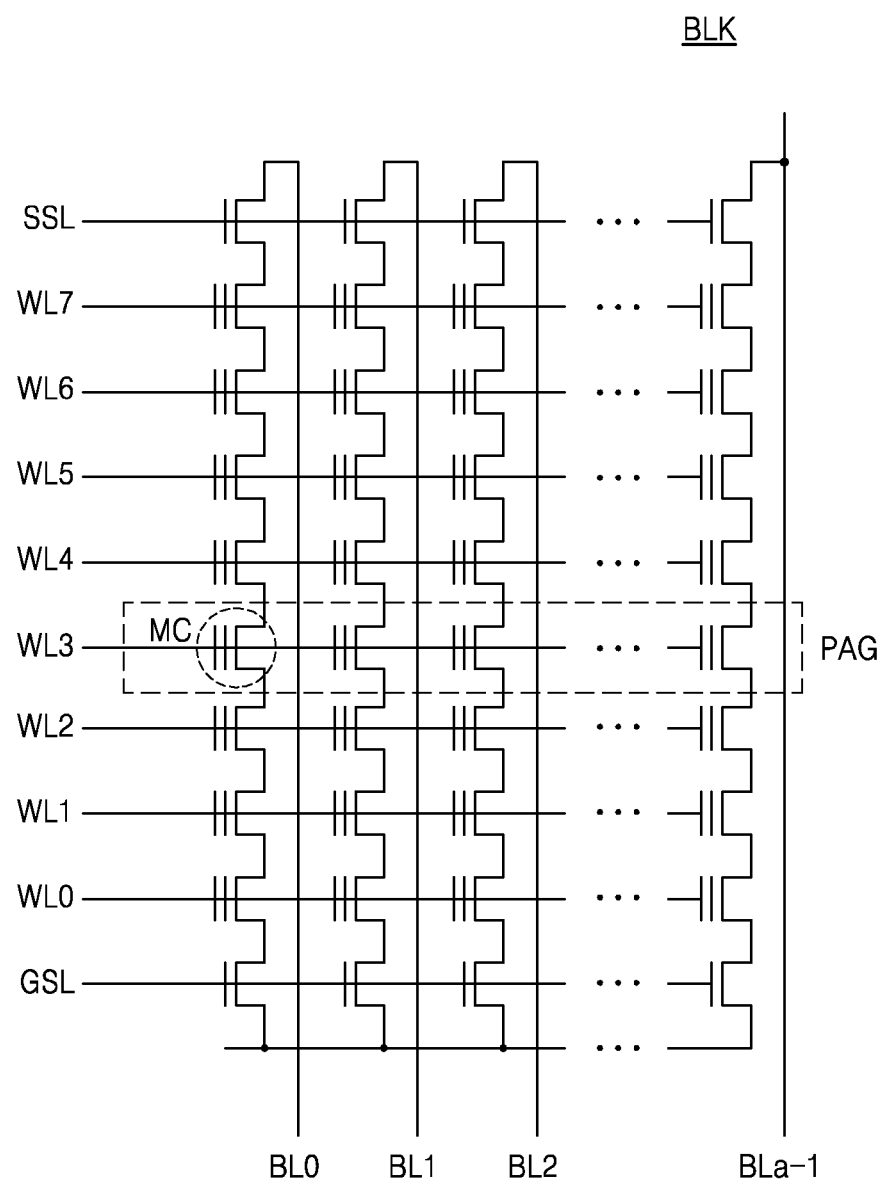
FIG. 2A is a block diagram showing a plane included in a memory cell array according to an exemplary embodiment of the inventive concept.

The memory cell array 120 of FIG. 1 may be a plane. The plane denotes a memory cell array 120 connected to a single page buffer circuit 110 that operates independently. Data of a page unit received from a memory controller may be stored in each plane. Data read out from the plane may be output to the memory controller via the page buffer circuit 110 corresponding to the plane. The non-volatile memory device 10 may perform a read operation and a write operation in units of pages, and may perform an erase operation in units of memory blocks. As shown in FIG. 2D to be described later, each plane includes a plurality of memory blocks. As shown in FIG. 2A, each of the memory blocks may include a plurality of pages.

According to an exemplary embodiment of the inventive concept, a two-dimensional (2D) memory cell array or a three-dimensional (3D) memory cell array is provided. The 3D memory cell array is formed monolithically on a physical level of at least one of memory cell arrays having a circuit formed on or in a silicon (Si) substrate as a circuit related to an operation of memory cells, with an active region arranged on the Si substrate. The term "monolithic"

means that layers of each level that constitute a cell array are stacked directly on layers of a lower level included in the cell array.

U.S. Pat. Nos. 7,679,133, 8,553,466, 8,654,587, and 8,559,235, and U.S. Pat. Pub. No. 2011/0233648 disclose appropriate features of a 3D memory array including a plurality of levels that share word lines and/or bit lines, and are incorporated by reference herein in their entireties. The memory cell array 120 will be described in detail later.

The row decoder 130 may select one of the memory blocks of the memory cell array 120 in response to a row address X-ADDR. The row decoder 130 may select one of the word lines WL0 through WLn-1 of the selected memory block. The row decoder 130 may transmit a word line voltage from a voltage generator to a word line WL (e.g., one of the word lines WL0 through WLn-1) of the selected memory block.

The control logic unit 140 may receive a command CMD and address ADDR, and, in response to the command CMD and the address ADDR, output various control signals for controlling the page buffer circuit 110 and the row decoder 130 to perform a program operation or a read operation.

According to an exemplary embodiment of the inventive concept, the control logic unit 140 may transmit a control signal CTRL_PB to the page buffer circuit 110 such that, while a cache latch included in at least one of the first page buffers is outputting data to the data I/O circuit 150, a data latch included in at least one of the second page buffers dumps data.

The control signal CTRL_PB may include a sense latch control signal LTCH_S, a data latch control signal LTCH_D, and a cache latch control signal LTCH_C. This will be described in detail below with reference to FIG. 7.

According to an exemplary embodiment of the inventive concept, the control logic unit 140 may read data from a memory cell MC according to the command CMD instructing a random read operation. In this case, the control logic unit 140 may transmit the control signal CTRL_PB to the page buffer circuit 110 such that a data latch included in the first page buffers dumps first data to a cache latch of the first page buffers and does not dump second data to respective cache latches of the second page buffers.

The data I/O circuit 150 may be connected to the page buffer circuit 110 via data lines DL, and may provide received data DTA to the page buffer circuit 110 or output data DTA received from the page buffer circuit 110 to the outside.

FIG. 2A is a block diagram showing a plane included in a memory cell array according to an exemplary embodiment of the inventive concept.

Referring to FIG. 2A, the memory cell array (for example, the memory cell array 120) may be a memory cell array of horizontal NAND flash memory and may include a plurality of memory blocks. Each memory block BLK may include a plurality of pages PAG each including a memory cells MC in a direction perpendicular to each of a plurality of bit lines BL0 through BLa-1.

In a NAND flash memory device having such a structure as shown in FIG. 2A, erasure is performed in units of blocks, and programming is performed in units of pages PAG respectively corresponding to word lines WL0 through WL7. FIG. 2A illustrates an example in which one block includes 8 pages PAG respectively corresponding to the 8 word lines WL0 through WL7. However, memory blocks of the memory cell array 120 according to exemplary embodiments of the inventive concept may include a different number of memory cells and pages. The non-volatile memory device 10 of FIG. 1 may include a plurality of memory cell arrays each having the same structure and performing the substantially the same operation as the above-described memory cell array 120.

Figure 2B:
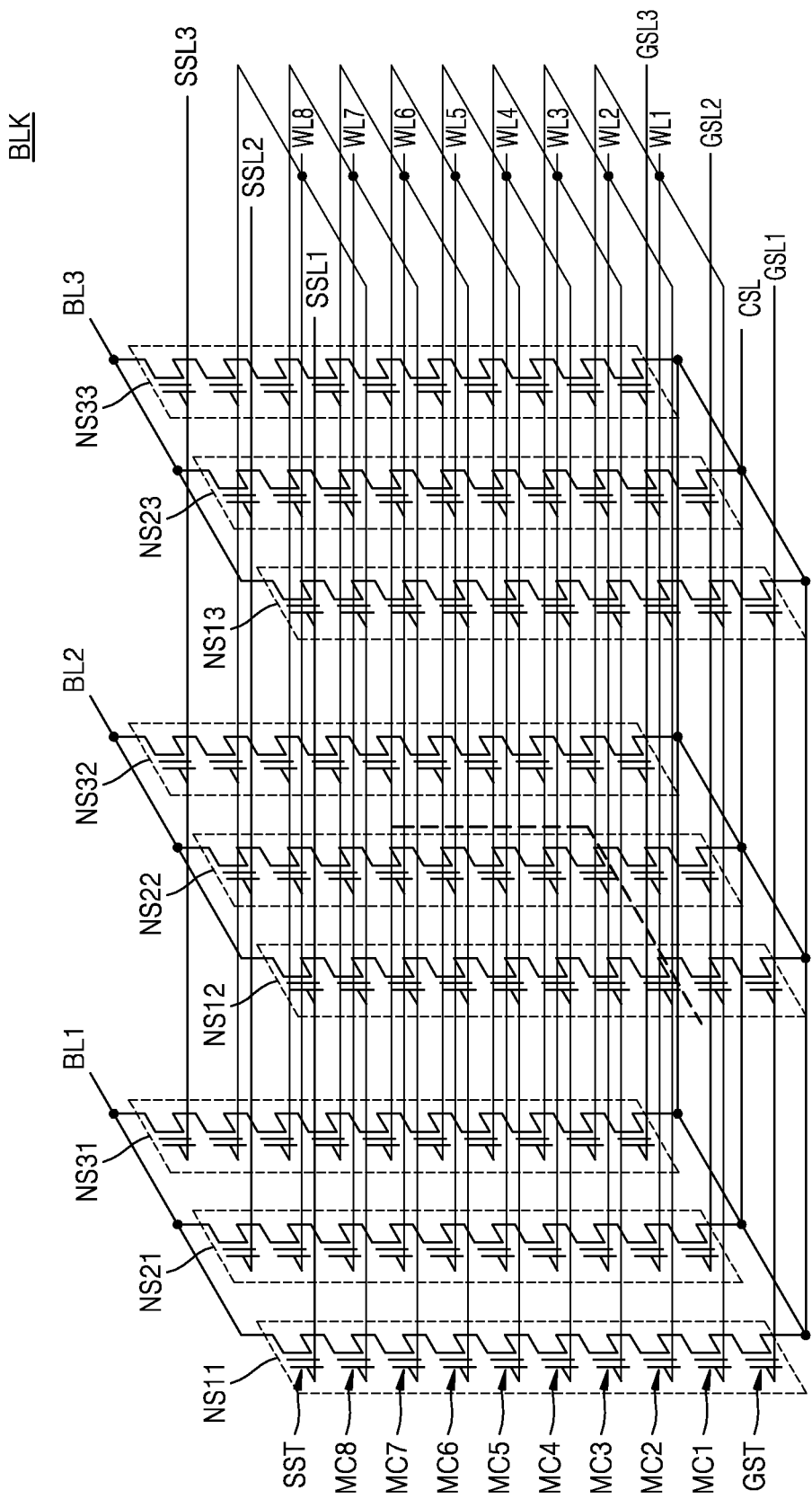
FIG. 2B is a circuit diagram showing a memory block included in a memory cell array according to an exemplary embodiment of the inventive concept.

FIG. 2B is a circuit diagram showing a memory block included in a memory cell array according to an exemplary embodiment of the inventive concept.

Referring to FIG. 2B, the memory cell array (for example, the memory cell array 120) may be a memory cell array of vertical NAND flash memory and may include a plurality of memory blocks. Each memory block BLK may include a plurality of NAND strings NS11 through NS33, a plurality of word lines WL1 through WL8, a plurality of bit lines BL1 through BL3, a plurality of ground select lines GSL1 through GSL3, a plurality of string select lines SSL1 through SSL3, and a common source line CSL. The number of NAND strings, the number of word lines, the number of bit lines, the number of ground select lines, and the number of string select lines may vary according to exemplary embodiments of the inventive concept.

The NAND strings NS11, NS21, and NS31 are provided between the bit line BL1, namely, a first bit line BL1, and the common source line CSL. The NAND strings NS12, NS22, and NS32 are provided between the bit line BL2, namely, a second bit line BL2, and the common source line CSL. The NAND strings NS13, NS23, and NS33 are provided between the bit line BL3, namely, a third bit line BL3, and the common source line CSL. Each (for example, NS11) of the NAND strings NS11, NS21, NS31, NS12, NS22, NS32, NS13, NS23, NS33 may include a string select transistor SST, a plurality of memory cells MC1 through MC8, and a ground select transistor GST that are serially connected to one another.

NAND strings commonly connected to one bit line configure one column. For example, the NAND strings NS11, NS21, and NS31 commonly connected to the first bit line BL1 may correspond to a first column, the NAND strings NS12, NS22, and NS32 commonly connected to the second bit line BL2 may correspond to a second column, and the NAND strings NS13, NS23, and NS33 commonly connected to the third bit line BL3 may correspond to a third column.

NAND strings commonly connected to one string select line configure one row. For example, the NAND strings NS11, NS12, and NS13 commonly connected to the string select line SSL1, namely, a first string select line SSL1, may correspond to a first row. The NAND strings NS21, NS22, and NS23 commonly connected to the string select line SSL2, namely, a second string select line SSL2, may correspond to a second row. The NAND strings NS31, NS32, and NS33 commonly connected to the string select line SSL3, namely, a third string select line SSL3, may correspond to a third row.

The string select transistors SST are connected to the corresponding first through third string select lines SSL1 through SSL3. The plurality of memory cells MC1 through MC8 are connected to the word lines WL1 through WL8, respectively. The ground select transistors GST are connected to the corresponding ground select lines GSL1 through GSL3. The string select transistors SST are connected to the corresponding bit lines BL1 through BL3, and the ground select transistors GST are connected to the common source line CSL.

Word lines (for example, WL1) of substantially the same height are commonly connected to one another, the string select lines SSL1 through SSL3 are separated from one another, and the ground select lines GSL1 through GSL3 are separated from one another. For example, when memory cells connected to the word line WL1, namely, a first word line WL1, and included in the NAND strings NS11, NS12, and NS13 are programmed, the first word line WL1 and the first string select line SSL1 are selected. According to an exemplary embodiment, the ground select lines GSL1 through GSL3 may be commonly connected to one another.

Figure 2C:
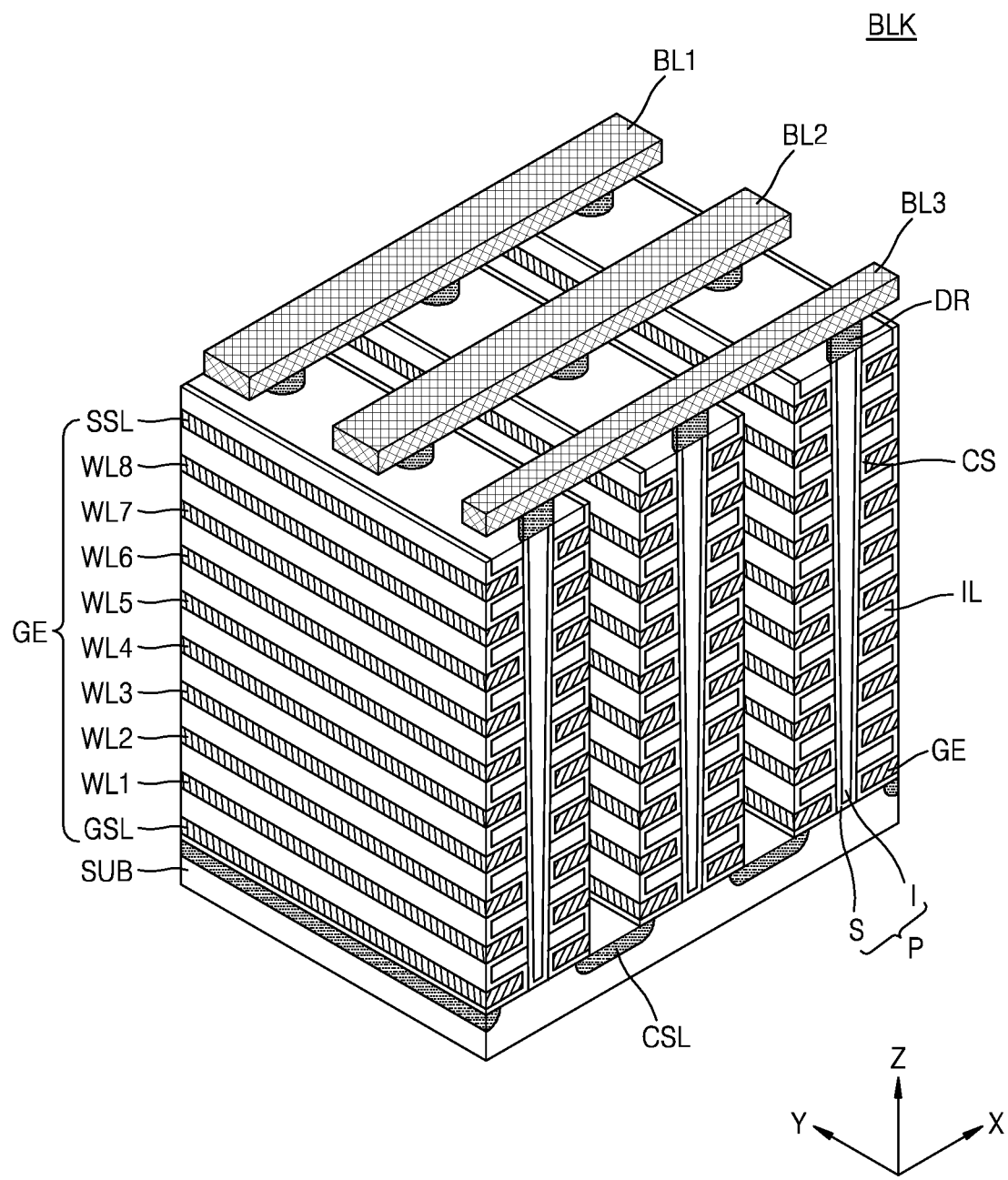
FIG. 2C is a perspective view of the memory block of FIG. 2B according to an exemplary embodiment of the inventive concept.
Figure 2D:
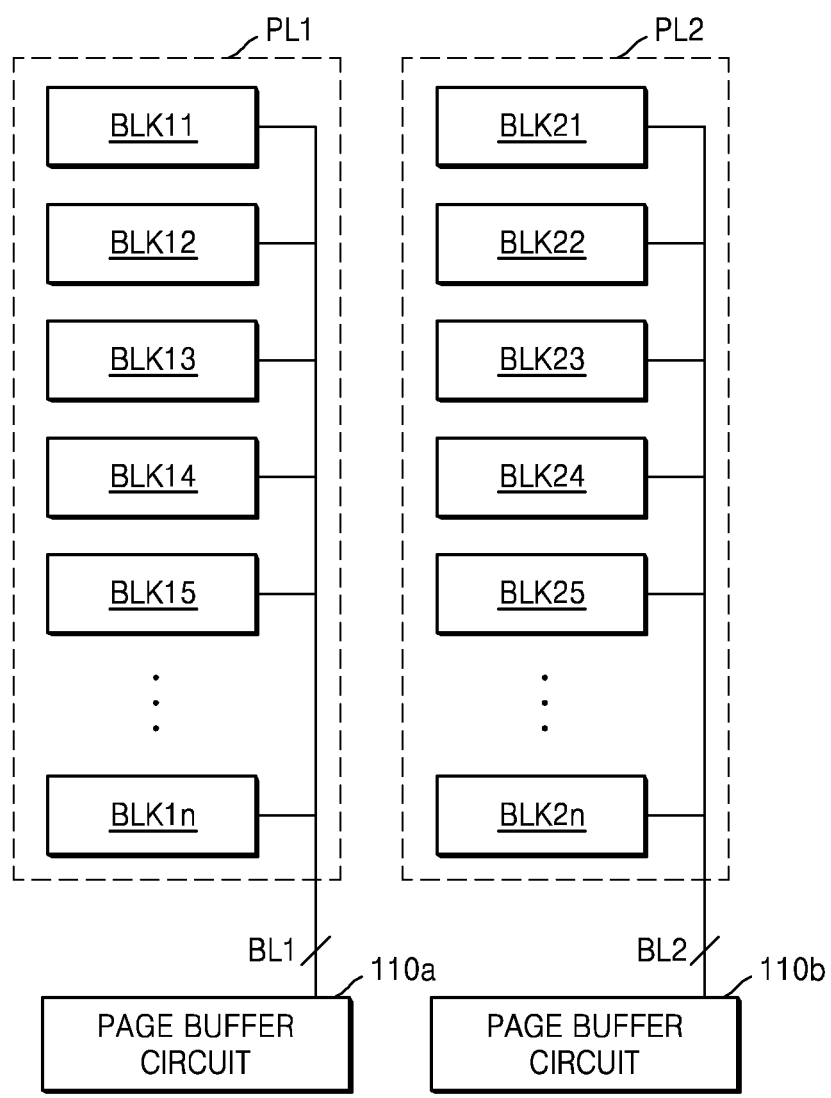
FIG. 2D is a block diagram of a plane according to an exemplary embodiment of the inventive concept.

FIG. 2C is a perspective view of the memory block of FIG. 2B according to an exemplary embodiment of the inventive concept.

Referring to FIG. 2C, each memory block included in a memory cell array (for example, the memory cell array 120 of FIG. 1) is formed in a vertical direction with respect to a substrate SUB. Although the memory block includes two select lines GSL and SSL, eight word lines WL1 through WL8, and three bit lines BL1 through BL3 in FIG. 2C, the numbers of select lines, word lines, and bit lines may vary.

The substrate SUB is of a first conductivity type (for example, a p type), and common source lines CSL each extending in a first direction (for example, a Y direction) and doped with impurities of a second conductivity type (for example, an n type) are provided on the substrate SUB. On a region of the substrate SUB between two adjacent common source lines CSL, a plurality of insulation layers IL each extending in the first direction are sequentially provided in a third direction (e.g., a Z direction), and the plurality of insulation layers IL are spaced apart from one another by a certain distance in the third direction. For example, the plurality of insulation layers IL may include an insulative material such as Si oxide.

On the region of the substrate SUB between two adjacent common source lines CSL, a plurality of pillars P are sequentially arranged in the first direction and penetrate through the plurality of insulation layers IL in the third direction. For example, the plurality of pillars P penetrate through the plurality of insulation layers IL and contact the substrate SUB. In detail, a surface layer S of each pillar P may include an Si material of the first conductivity type and may function as a channel region. An internal layer I of each pillar P may include an insulative material, such as Si oxide, or an air gap.

In a region between two adjacent common source lines CSL, a charge storage layer CS is provided along exposed surfaces of the insulation layers IL, the pillars P, and the substrate SUB. The charge storage layer CS may include a gate insulation layer (or a tunnel insulation layer), a charge trapping layer, and a blocking insulation layer. For example, the charge storage layer CS may have an oxide-nitride-oxide (ONO) structure. In the region between two adjacent common source lines CSL, a gate electrode GE, such as the select lines GSL and SSL and the word lines WL1 through WL8, is also provided on an exposed surface of the charge storage layer CS.

Drains or drain contacts DR are respectively provided on the plurality of pillars P. For example, the drains or drain contacts DR may include an Si material doped with impurities of the second conductivity type. The bit lines BL1 through BL3, each extending in a second direction (for example, an X direction) and spaced apart from one another by a certain distance in the first direction, are provided on the drains DR.

FIG. 2D is a block diagram of a plane according to an exemplary embodiment of the inventive concept.

Referring to FIGS. 1 and 2D, each of first and second planes PL1 and PL2 included in the memory cell array 120 may include a plurality of memory blocks BLK connected to bit lines (for example, BL1). Each of the plurality of memory blocks BLK may be one of the memory blocks BLK of FIGS. 2A through 2C. The first and second planes PL1 and PL2 may include a plurality of pages PAGE included in the plurality of memory blocks BLK.

A plurality of memory blocks BLK11 through BLK1n and a plurality of memory blocks BLK21 through BLK2n may be connected to first and second page buffer circuits 110a and 110b via first and second bit lines BL1 and BL2, respectively. For example, the memory blocks BLK11 through BLK1n included in the first plane PL1 may be connected to the first page buffer circuit 110a via the first bit lines BL1. The memory blocks BLK21 through BLK2n included in the second plane PL2 may be connected to the second page buffer circuit 110b via the second bit lines BL2. In other words, the memory blocks BLK11 through BLK1n included in the first plane PL1 may share the first bit lines BL1, and the memory blocks BLK21 through BLK2n included in the second plane PL2 may share the second bit lines BL2. Although FIG. 2D illustrates only two planes, e.g., the first and second planes PL1 and PL2, this is merely an example, and the number of planes PL may vary. The number of page buffer circuits 110 may also vary in correspondence with the number of planes.

Figure 3:
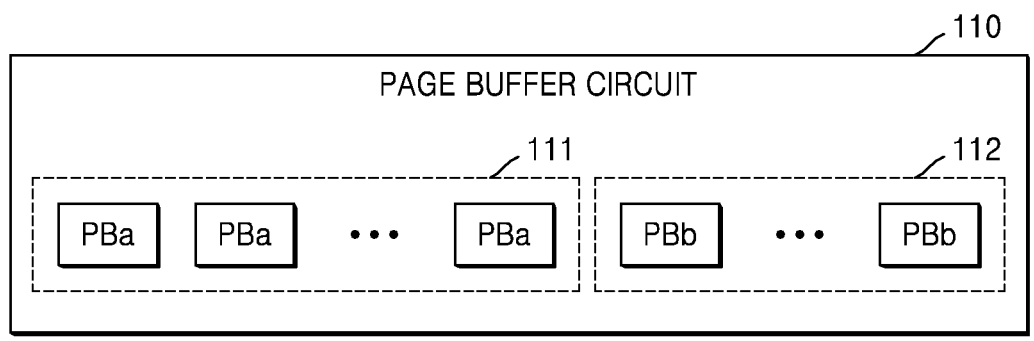
FIG. 3 is a block diagram of a page buffer circuit according to an exemplary embodiment of the inventive concept.

FIG. 3 is a block diagram of a page buffer circuit according to an exemplary embodiment of the inventive concept.

Referring to FIGS. 1 and 3, the page buffer circuit 110 may include the plurality of page buffers PB1 through PBm that may be first page buffers 111 and second page buffers 112. The first page buffers 111 may include first page buffers PBa and the second page buffers 112 may include second page buffers PBb.

For example, the first page buffers 111 may include some of the plurality of page buffers PB1 through PBm of FIG. 1, and the second page buffers 112 may include some others of the plurality of page buffers PB1 through PBm of FIG. 1.

As another example, the first page buffers 111 may include some of the plurality of page buffers PB1 through PBm of FIG. 1, and the second page buffers 112 may include the others or the remaining of the plurality of page buffers PB1 through PBm of FIG. 1. Internal structures of the first page buffer PBa and the second page buffer PBb may be substantially the same as each other.

Figure 4:
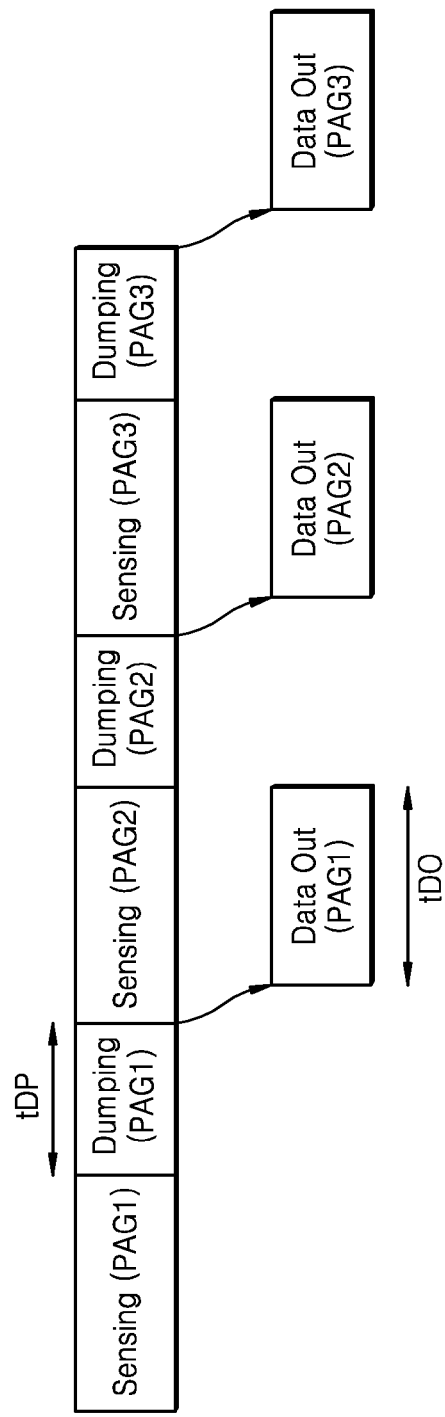
FIG. 4 is a data flow diagram for explaining a method of sensing and outputting data of a plurality of pages, according to an exemplary embodiment of the inventive concept.

FIG. 4 is a data flow diagram for explaining a method of sensing and outputting data of a plurality of pages, according to an exemplary embodiment of the inventive concept.

In general, a sense latch included in a page buffer circuit senses data stored in a memory cell of a first page PAG1, and dumps the data of the first page PAG1 to a cache latch included in the page buffer circuit. While the cache latch is outputting the dumped data of the first page PAG1, the sense latch may sense data of a second page PAG2, because an operation of sensing a bit line and an operation of outputting data are performed in different latches.

Referring to FIG. 4, because considerable loading occurs due to, for example, a physical separation distance between the sense latch and the cache latch, considerable time is taken to perform dumping. When a time period during which a sense latch dumps data of a page PAG to another latch is reduced, read operation efficiency may be improved.

Figure 5:
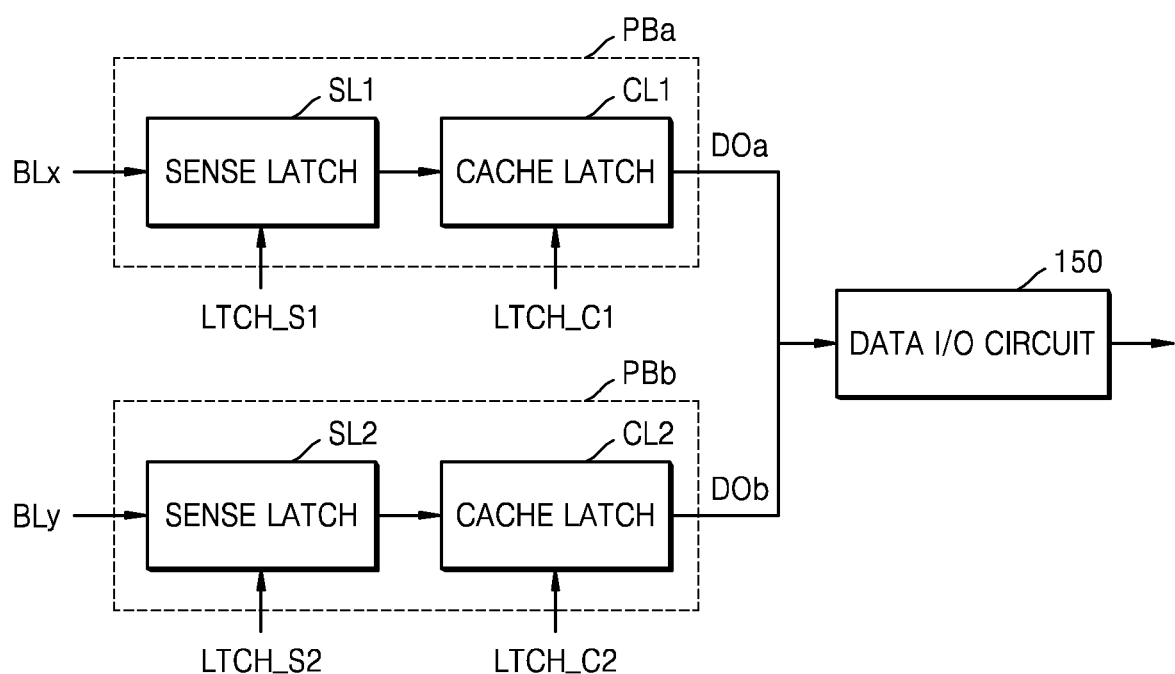
FIG. 5 is a block diagram of the page buffer circuit of FIG. 3 according to an exemplary embodiment of the inventive concept.
Figure 6:
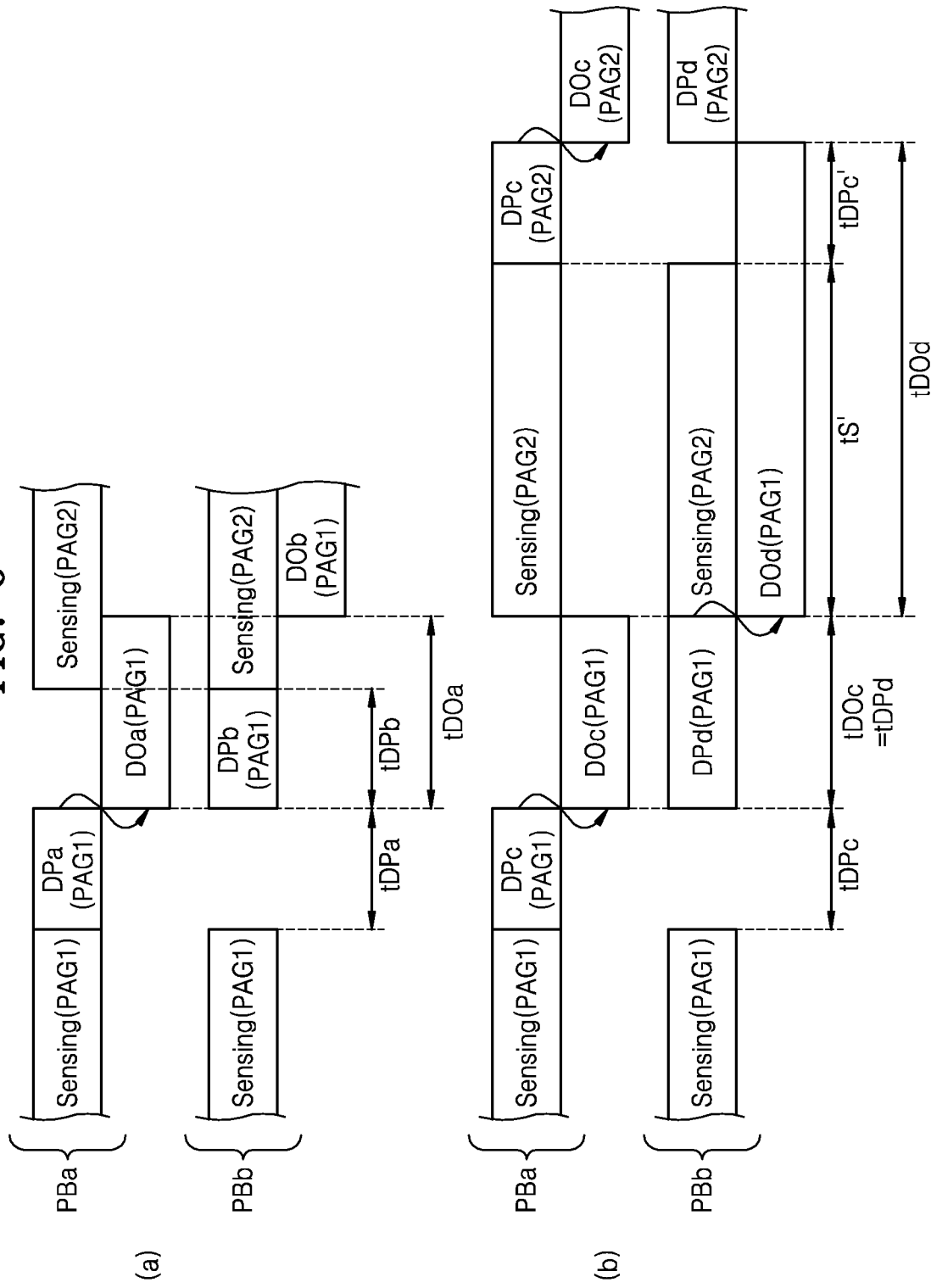
FIG. 6 is a data flow diagram for explaining an operation of the page buffer circuit of FIG. 5 according to an exemplary embodiment of the inventive concept.

FIG. 5 is a block diagram of the page buffer circuit of FIG. 3 according to an exemplary embodiment of the inventive concept, and FIG. 6 is a data flow diagram for explaining an operation of the page buffer circuit 110 of FIG. 5 according to an exemplary embodiment of the inventive concept.

Referring to FIG. 5, the page buffer circuit 110 may include a first page buffer PBa and a second page buffer PBb.

Each of the first and second page buffers PBa and PBb may perform a sequential read operation on the data stored in the memory cell array 120 in units of pages PAG. For example, the first page buffer PBa and the second page buffer PBb may sense and output the data stored in the first page PAG1, and sense and output the data stored in the second page PAG2. Referring to FIG. 5, a bit line BLx and a bit line BLy may be bit lines intersecting with the same word line. The first page buffer PBa and the second page buffer PBb may operate together to read data of the same page (for example, the first page PAG1).

The first page buffer PBa may include a first sense latch SL1 and a first cache latch CL1, and the second page buffer PBb may include a second sense latch SL2 and a second cache latch CL2. The first sense latch SL1 may be electrically connected to the bit line BLx, and the second sense latch SL2 may be electrically connected to the bit line BLy. Based on a first sense latch control signal LTCH_S1 and a second sense latch control signal LTCH_S2, the first sense latch SL1 and the second sense latch SL2 may sense the data stored in a memory cell MC from a sense out voltage VSO of a sense out node (for example, SO of FIG. 12A) and may store the sensed data. Based on the first sense latch control signal LTCH_S1 and the second sense latch control signal LTCH_S2, the first sense latch SL1 and the second sense latch SL2 may dump (indicated by DPa) the data to the first cache latch CL1 and may dump (indicated by DPb) the data to the second cache latch CL2, respectively. For example, a time point when the first sense latch SL1 dumps data to the first cache latch CL1 may be different from a time point when the second sense latch SL2 dumps the data to the second cache latch CL2. As another example, a time section during which the first sense latch SL1 dumps data to the first cache latch CL1 may overlap at least partially a time section during which the second sense latch SL2 dumps data to the second cache latch CL2.

The first cache latch CL1 may transmit (indicated by DOa) the dumped data to the data I/O circuit 150, based on a first cache latch control signal LTCH_C1, and the second cache latch CL2 may transmit (indicated by DOb) the dumped data to the data I/O circuit 150, based on a second cache latch control signal LTCH_C2. The data I/O circuit 150 may output the data received from the first cache latch CL1, and may output the data received from the second cache latch CL2.

Referring to FIG. 5 and FIG. 6(*a*), the first sense latch SL1 and the second sense latch SL2 may sense the data stored in the same page PAG. The first sense latch SL1 may dump (DPa) a portion of the data stored in the same page PAG to the first cache latch CL1, and the second sense latch SL2 may dump (DPb) a remaining portion of the data stored in the same page PAG to the second cache latch CL2. In other words, data may be dumped a plurality of numbers of times from the first and second sense latches SL1 and SL2 to the first and second cache latches CL1 and CL2, respectively. For example, after the first sense latch SL1 dumps (DPa) data to the first cache latch CL1, the second sense latch SL2 may dump (DPb) data to the second cache latch CL2. As another example, during at least a portion of a time period during which the first sense latch SL1 dumps (DPa) data to the first cache latch CL1, the second sense latch SL2 may dump (DPb) data to the second cache latch CL2. For example, the same page PAG may be the first page PAG1.

The first sense latch SL1 may dump the sensed data to the first cache latch CL1 during a time period tDPa. Thereafter, while the first cache latch CL1 is transmitting the data to the data I/O circuit 150, the second sense latch SL2 may dump (DPb) data to the second cache latch CL2. In other words, during a time period tDPb, the first cache latch CL1 may transmit a portion of the data stored in the first page PAG1 to the data I/O circuit 150, and the second sense latch SL2 may dump a remaining portion of the data stored in the first page PAG1 to the second cache latch CL2.

A time period tDOa during which the first cache latch CL1 transmits data to the data I/O circuit 150 may be greater than or equal to the time period tDPb during which the second sense latch SL2 dumps data to the second cache latch CL2. A time point when an operation DOa in which the first cache latch CL1 transmits data to the data I/O circuit 150 is completed may be later than a time point when an operation DPb in which the second sense latch SL2 dumps data to the second cache latch CL2 is completed.

A size of the data dumped by the first page buffers 111 may be substantially the same as that of the data dumped by the second page buffers 112. A dumping time period of the first page buffers 111 may be substantially the same as that of the second page buffers 112. For example, a portion of the data stored in the first page PAG1 and dumped by the first sense latches SL1 to the first cache latches CL1 may have substantially the same size as data dumped from the second sense latches SL2 to the second cache latches CL2, and a dumping duration of the portion of the data stored in the first page PAG1 and dumped by the first sense latches SL1 to the first cache latches CL1 may be substantially the same as that of the data dumped from the second sense latches SL2 to the second cache latches CL2. As another example, the first sense latches SL1 may dump (DPa) half of the data stored in the first page PAG1 to the first cache latches CL1, and the second sense latches SL2 may dump (DPb) a remaining half of the data stored in the first page PAG1 to the second cache latches CL2. In other words, the first sense latches SL1 and the second sense latches SL2 may dump data having a data size corresponding to a half of the size of the page PAG. For example, the first sense latches SL1 may be all sense latches included in the first page buffers 111. The first cache latches CL1 and the second sense latches SL2 may be all cache latches and all sense latches included in the first and second page buffers 111 and 112, respectively, and sense latches, cache latches, and data latches described later may be similarly interpreted.

Referring to FIG. 5 and FIG. 6(*b*), the first sense latches SL1 may dump (DPc) a portion of the data stored in the first page PAG1 to the first cache latches CL1, and the second sense latches SL2 may dump (DPd) a remaining portion of the data stored in the first page PAG1 to the second cache latches CL2. Optimization may be performed to reduce a time period of reading data from a plurality of pages. In some cases, to perform the optimization, a size of the data dumped by the second sense latches SL2 to the second cache latches CL2 may be greater than a size of the data dumped by the first sense latches SL1 to the first cache latches CL1. A time period tDPd taken for the second sense latches SL2 to dump data to the second cache latches CL2 may be greater than a time period tDPc taken for the first sense latches SL1 to dump data to the first cache latches CL1.

A time period tDOc taken for the first cache latch CL1 to transmit data to the data I/O circuit 150 may be substantially equal to the time period tDPd taken for the second sense latch SL2 to dump data to the second cache latch CL2. Accordingly, the first sense latch SL1 and the second sense latch SL2 may sense data stored in a next page (for example, the second page PAG2) quickly, and finally may read the data stored in the memory cell array 120 quickly. In other words, a time point when an operation in which the first cache latch CL1 transmits data to the data I/O circuit 150 is completed may be substantially the same as a time point when an operation in which the second sense latch SL2 dumps data to the second cache latch CL2 is completed.

A time period tDOd taken for the second cache latch CL2 to transmit data to the data I/O circuit 150 may be substantially equal to a sum of a time period tS' during which the first sense latch SL1 senses data and a time period tDPc' during which the first sense latch SL1 dumps data to the first cache latch CL1. In other words, a time point when the second cache latch CL2 completes transmitting the data stored in the first page PAG1 to the data I/O circuit 150 may be substantially equal to a time point when the first sense latch SL1 completes sensing the data of the second page PAG2 and dumping the sensed data to the first cache latch CL1. For example, the time period tDOd may be equal to a sum of the time period tS' and the time period tDPc' (namely, tDO=tS'+tDPc').

In contrast with FIG. 6(b), according to exemplary embodiments of the inventive concept, the time period tDOd during which data is output may be somewhat shortened. For example, the time period tDOd taken for the second cache latch CL2 to transmit (DOd) data to the data I/O circuit 150 may be less than the sum of the time period tS' during which the first sense latch SL1 senses data and the time period tDPc' during which the first sense latch SL1 dumps data to the first cache latch CL1. For example, the time period tDOd may be less than the sum of the time period tS' and the time period tDPc' (namely, tDOd<tS'+tDPc'). As another example, the time period tDOd may be greater than the sum of the time period tS' and the time period tDPc' (namely, tDOd>tS'+tDPc'). In this case, sensing of the second page PAG2 may be somewhat delayed.

Figure 7:
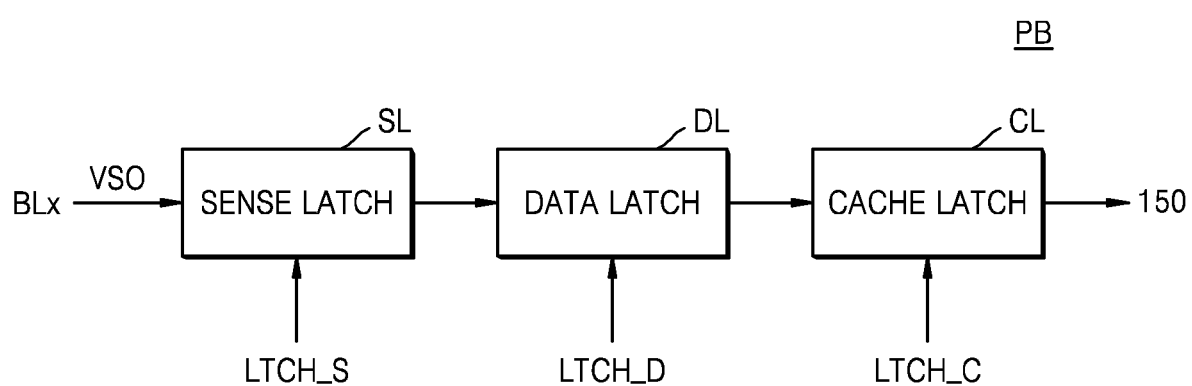
FIG. 7 is a block diagram of a page buffer according to an exemplary embodiment of the inventive concept.

FIG. 7 is a block diagram of a page buffer according to an exemplary embodiment of the inventive concept.

Referring to FIG. 7, the page buffer PB may include a sense latch SL, a data latch DL, and a cache latch CL. The sense latch SL may dump data to the data latch DL. The data latch DL may dump data to the cache latch CL. The cache latch CL may transmit data to the data I/O circuit 150.

The sense latch SL may be electrically connected to the bit line BLx, and, based on a sense latch control signal LTCH_S, may sense the data stored in the memory cell MC from the sense out voltage VSO of the sense out node (for example, SO of FIG. 12A) and store the sensed data. The sense latch SL may dump the stored data, based on the sense latch control signal LTCH_S.

Based on a data latch control signal LTCH_D, the data latch DL may receive the data dumped by the sense latch SL and may dump the received data to the cache latch CL. In some cases, data latches DL may selectively dump the data dumped by the sense latch SL. For example, some data latches DL may maintain data without dumping the data to the cache latch CL.

Based on a cache latch control signal LTCH_C, the cache latch CL may transmit the data dumped by the data latch DL to the data I/O circuit 150.

A latch control signal including the sense latch control signal LTCH_S, the data latch control signal LTCH_D, and the cache latch control signal LTCH_C may be included in the page buffer control signal CTRL_PB of FIG. 1.

Figure 8:
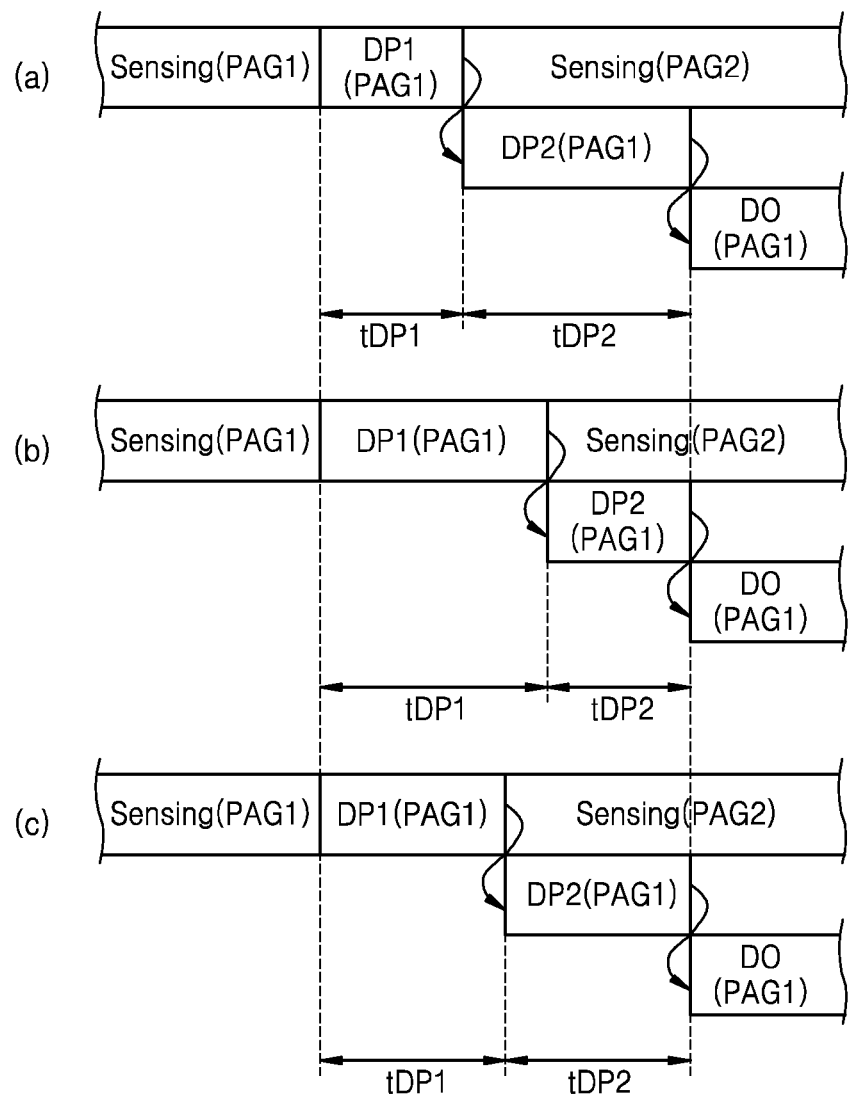
FIG. 8 is a data flow diagram for explaining an operation of a page buffer, according to an exemplary embodiment of the inventive concept.

FIG. 8 is a data flow diagram for explaining an operation of a page buffer, according to an exemplary embodiment of the inventive concept.

Referring to FIGS. 7 and 8, the sense latch SL may sense the data of the first page PAG1 from the sense out voltage VSO. Thereafter, the sense latch SL may dump (DP1) the data of the first page PAG1 to the data latch DL. The data latch DL may dump (DP2) the dumped data to the cache latch CL.

While the data latch DL is performing the dumping (DP2), the sense latch SL may sense the data of the second page PAG2. In other words, a sensing operation and a dumping operation, in which the sense latch SL and the data latch DL different from each other are involved, may be performed in parallel. The cache latch CL may dump (DO) the data dumped by the data latch DL.

Referring to FIG. 8(a), a time period tDP1 during which the sense latch SL included in the page buffer PB dumps data to the data latch DL may be less than a time period tDP2 during which the data latch DL dumps the data to the cache latch CL. For example, a physical distance between the sense latch SL and the data latch DL may be less than a physical distance between the data latch DL and the cache latch CL. As another example, a length of a current path from the sense latch SL to the data latch DL may be less than that of a current path from the data latch DL to the cache latch CL. As another example, the number of latches included between the data latch DL and the cache latch CL may be less than the number of latches included between the sense latch SL and the data latch DL. In other words, according to exemplary embodiments of the inventive concept, loading may be adjusted according to, for example, a physical distance between different latches, a current path therebetween, or the number of other latches included therebetween.

Referring to FIG. 8(a), the page buffer PB according to an exemplary embodiment of the inventive concept reduces the time period tDP1 during which the sense latch SL dumps the data of the first page PAG1 to the data latch DL, and thus a time point when the sense latch SL senses the data of the second page PAG2 may be advanced. In other words, according to an exemplary embodiment of the inventive concept, in a sequential read operation, the page buffer PB may quickly sense the data of a next page PAG.

Referring to FIG. 8(b), the time period tDP1 during which the sense latch SL included in the page buffer PB dumps data to the data latch DL may be greater than the time period tDP2 during which the data latch DL dumps the data to the cache latch CL. For example, the physical distance between the sense latch SL and the data latch DL may be greater than the physical distance between the data latch DL and the cache latch CL. As another example, the current path from the sense latch SL to the data latch DL may be longer than the current path from the data latch DL to the cache latch CL. As another example, the number of latches included between the data latch DL and the cache latch CL may be greater than the number of latches included between the sense latch SL and the data latch DL. According to exemplary embodiments of the inventive concept, in the case of FIG. 8(b) (for example, when the time period tDP1 is greater than the time period tDP2), a time point when transmission of the data stored in pages subsequent to the first page PAG1 to the data I/O circuit 150 is started may be earlier than in the case of FIG. 8(a) (for example, when the time period tDP1 is less than the time period tDP2).

Referring to FIG. 8(c), the time period tDP1 during which the sense latch SL included in the page buffer PB dumps data to the data latch DL may be equal to or substantially equal to the time period tDP2 during which the data latch DL dumps data to the cache latch CL. For example, the physical distance between the sense latch SL and the data latch DL may be equal to the physical distance between the data latch DL and the cache latch CL. As another example, the length of the current path from the sense latch SL to the data latch DL may be equal to the length of the current path from the data latch DL to the cache latch CL. As another example, the number of latches included between the sense latch SL and the data latch DL may be equal to the number of latches included between the data latch DL and the cache latch CL. In other words, according to exemplary embodiments of the inventive concept, loading may be adjusted according to, for example, a physical distance between different latches, a current path therebetween, or the number of other latches included therebetween.

Figure 9:
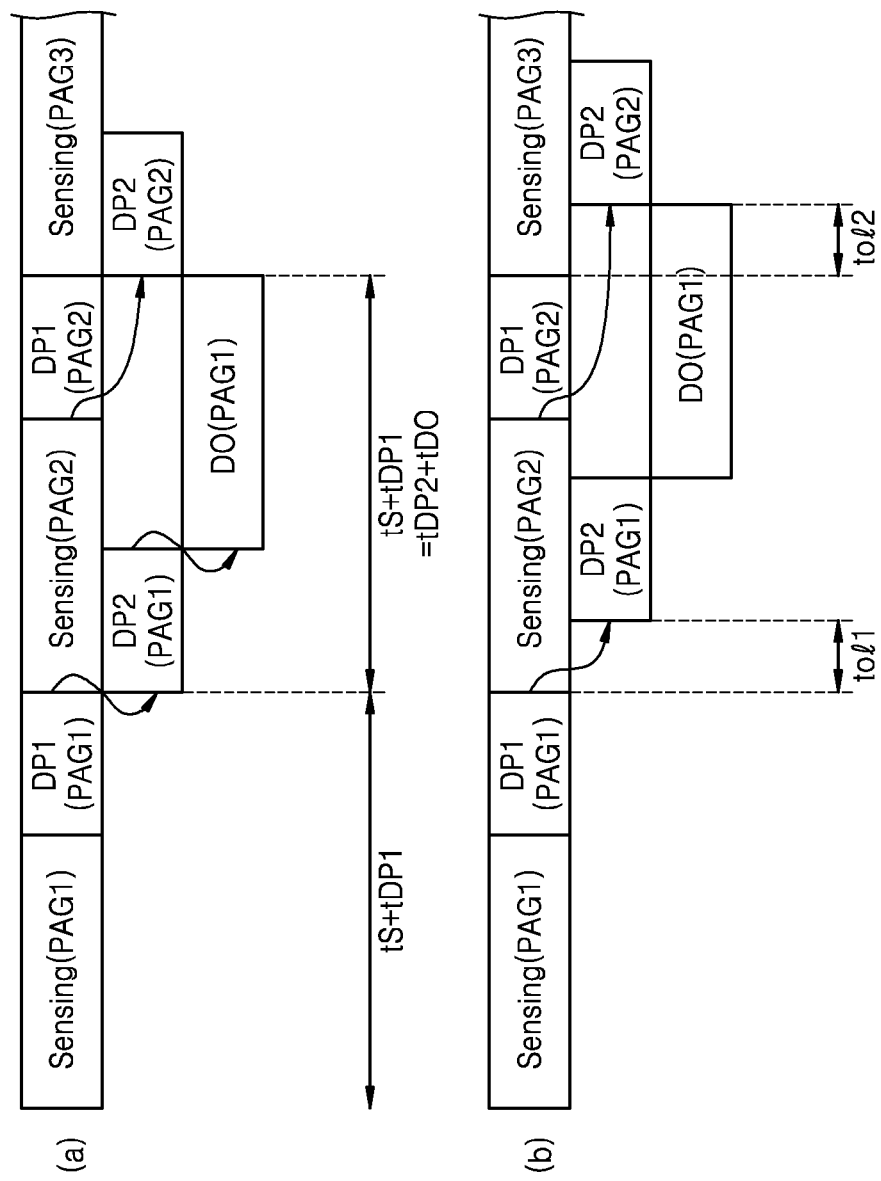
FIG. 9 is a data flow diagram for explaining an operation of a page buffer, according to an exemplary embodiment of the inventive concept.

FIG. 9 is a data flow diagram for explaining an operation of a page buffer, according to an exemplary embodiment of the inventive concept.

Referring to FIG. 9(a), a sum of a time period tS during which the sense latch SL senses data and a time period tDP1 during which the sense latch SL dumps data to the data latch DL may be equal to a sum of a time period tDP2 during which the data latch DL dumps data to the cache latch CL and a time period tDO during which the cache latch CL transmits data (for example, tS+tDP1=tDP2+tDO). The data dumped to the data latch DL may be data included in an arbitrary page PAG. For example, the sense latch SL may sense and dump (DP1) the data of the first page PAG1, and may sense and dump (DP1) the data of the second page PAG2.

Referring to FIG. 9(b), the data latch DL may dump the data dumped by the sense latch SL to the data latch DL after a time period toI1. Accordingly, while the sense latch SL is sensing the data of a third page PAG3 during a time period toI2, the cache latch CL may sense the data of the first page PAG1. In other words, the page buffer PB according to an exemplary embodiment of the inventive concept may output the data of an N-th page while sensing the data of an (N+2)th page.

Figure 10:
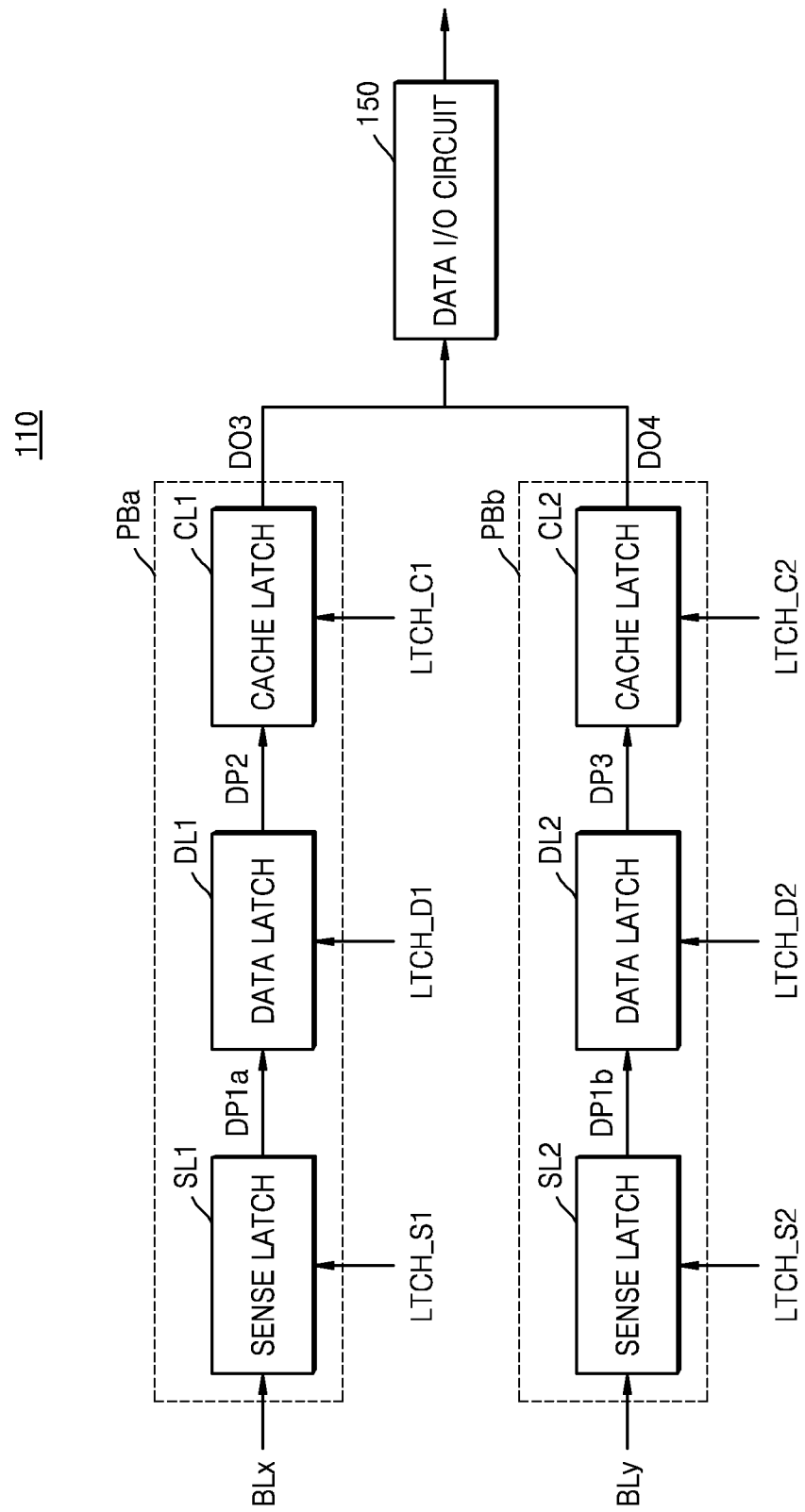
FIG. 10 is a block diagram of a page buffer including first page buffers and second page buffers, according to an exemplary embodiment of the inventive concept.
Figure 11:
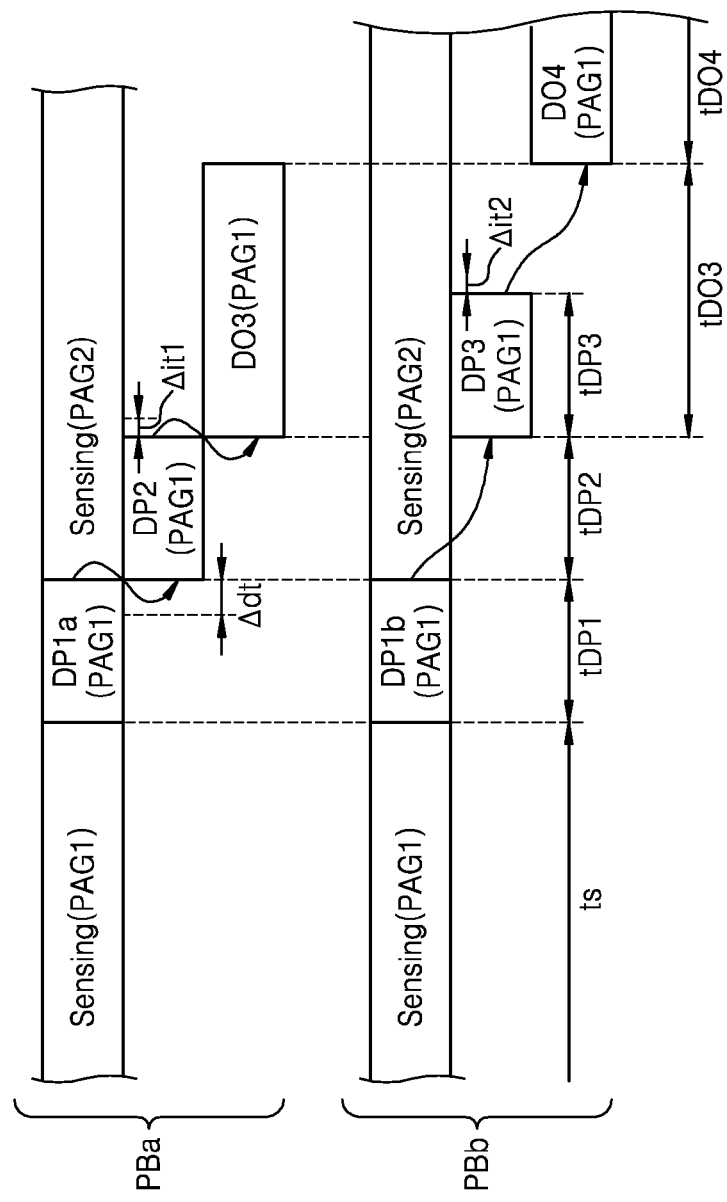
FIG. 11 is a data flow diagram for explaining operations of the first page buffers and the second page buffers of FIG. 10, according to an exemplary embodiment of the inventive concept.

FIG. 10 is a block diagram of a page buffer including first page buffers and second page buffers, according to an exemplary embodiment of the inventive concept. FIG. 11 is a data flow diagram for explaining operations of the first page buffers and the second page buffers of FIG. 10, according to an exemplary embodiment of the inventive concept.

Referring to FIG. 10, a first page buffer PBa is one page buffer from among the first page buffers 111, and the second page buffer PBb is one page buffer from among the second page buffers 112. Latch control signals (LTCH_S1, LTCH_S2, LTCH_D1, LTCH_D2, LTCH_C1, and LTCH_C2) may be included in the page buffer control signal CTRL_PB of FIG. 1.

Referring to FIGS. 10 and 11, the first and second page buffers PBa and PBb may perform a sequential read operation on the data stored in the memory cell array 120 in units of pages PAG. Accordingly, referring to FIG. 10, the bit line BLx and the bit line BLy may be bit lines intersecting with the same word line. The first page buffer PBa and the second page buffer PBb may operate together to read the data of the same page (for example, the first page PAG1).

Referring to FIG. 10, the control logic unit 140 may control the page buffer circuit 110 such that the first and second sense latches SL1 and SL2 respectively included in the first page buffer PBa and the second page buffer PBb sense voltages from a plurality of bit lines of the same page PAG and dump data to first and second data latches DL1 and DL2. For example, the first sense latch SL1 may store data corresponding to a sensed voltage and dump (DP1a) the stored data to the first data latch DL1, based on the first sense latch control signal LTCH_S1. The second sense latch SL2 may store the data corresponding to the sensed voltages and dump (DP1b) the stored data to the second data latch DL2, based on the second sense latch control signal LTCH_S2. For example, pieces of data respectively dumped (DP1a and DP1b) by the first sense latch SL1 and the second sense latch SL2 may be pieces of data stored in all of the memory cells included in a single page PAG.

Referring to FIG. 11, based on the first and second sense latch control signals LTCH_S1 and LTCH_S2, the first sense latch SL1 may sense and store a portion of the data of the first page PAG1 and dump the stored data (DP1a), and the second sense latch SL2 may sense and store another portion of the data of the first page PAG1 and dump the stored data (DP1b), respectively.

Referring back to FIG. 10, the control logic unit 140 may control the page buffer circuit 110 such that the first data latch DL1 stores the data dumped by the first sense latch SL1 and dump the stored data to the first cache latch CL1. For example, the first data latch DL1 may store data in response to a first data latch control signal LTCH_D1 instructing storing of the dumped data. The first data latch DL1 may dump (DP2) data in response to a first data latch control signal LTCH_D1 instructing dumping of stored data.

The control logic unit 140 may control the page buffer circuit 110 such that, while the first data latch DL1 is dumping (DP2) data, the second data latch DL2 postpones dumping (DP3). For example, after the control logic unit 140 transmits the first data latch control signal LTCH_D1 instructing dumping of the stored data to the first data latch DL1, the control logic unit 140 may transmit a second data latch control signal LTCH_D2 instructing storing of the data dumped by the second sense latch SL2 to the second data latch DL2.

According to an exemplary embodiment of the inventive concept, the control logic unit 140 may control the page buffer circuit 110 such that the first cache latch CL1 transmits (DO3) the data dumped by the first data latch DL1 to the data I/O circuit 150. The control logic unit 140 may also control the page buffer circuit 110 such that the second data latch DL2 dumps (DP3) the stored data to the second cache latch CL2.

In detail, the control logic unit 140 may control the page buffer circuit 110 such that, during at least a portion of a time section during which the first cache latch CL1 transmits (DO3) data to the data I/O circuit 150, the second data latch DL2 dumps (DP3) data.

Referring to FIG. 11, during at least a portion of the time section during which the first cache latch CL1 transmits (DO3) data to the data I/O circuit 150, the second data latch DL2 may dump (DP3) data. For example, the control logic unit 140 may transmit a first cache latch control signal LTCH_C1 instructing transmission of stored data to the first cache latch CL1, and may transmit the second data latch control signal LTCH_D2 instructing dumping of the stored data to the second data latch DL2.

In this case, a time period tDP3 during which the second data latch DL2 dumps data may be less than a time period tDO3 during which the first cache latch CL1 transmits data to the data I/O circuit 150. Accordingly, while the data transmit operation (DO3) is being completed, the second data latch DL2 may hide a time period taken for the data dumping operation DP3 in a time period taken for the data transmit operation DO3 by performing the data dumping operation DP3. Accordingly, it may be considered that there are substantially no additional time periods corresponding to the data dumping operation DP3 in the page buffer circuit

110. According to an experiment, a read time period taken to read one memory block BLK may be reduced by about 40%.

Referring back to FIG. 10, the control logic unit 140 may control the page buffer circuit 110 such that the second cache latch CL2 outputs data. For example, the control logic unit 140 may transmit the second cache latch control signal LTCH_C2 instructing outputting of the stored data to the second cache latch CL2.

According to an exemplary embodiment of the inventive concept, an overall time period taken for the page buffer circuit 110 to sense data and transmit the sensed data to the data I/O circuit 150 may be reduced. A time period taken to dump data corresponding to the first page PAG1 will now be described with reference to FIGS. 4 and 11.

Referring to FIG. 4, the time period tDP is taken to dump from a sense latch to a cache latch. Referring to FIG. 11, a time period tDP1 is taken to dump data from the first and second sense latches SL1 and SL2 to the first and second data latches DL1 and DL2, a time period tDP2 is taken to dump data from the first data latch DL1 to the first cache latch CL1, and a time period tDP3 is taken to dump data from the second data latch DL2 to the second cache latch CL2.

Referring to FIG. 4, the cache latch transmits the data of the first page PAG1 during the time period tDO. Referring to FIG. 11, the data transmitted by the first cache latch CL1 and the data transmitted by the second cache latch CL2 may be the data of the first page PAG1. In this case, the first cache latch CL1 transmits data during a time period tDO3, and the second cache latch CL2 transmits data during a time period tDO4. Accordingly, the time period tDO may be equal to a sum of the time period tDO3 and the time period tDO4, because all of the cache latch of FIG. 4 and the first and second cache latches CL1 and CL2 of FIG. 11 transmit the data of the first page PAG1.

According to an exemplary embodiment of the inventive concept, the first page buffers 111 and the second page buffers 112 may sense pieces of data having substantially the same numbers of bits from the page PAG and output the sensed pieces of data. In other words, the first page buffers 111 and the second page buffers 112 may halve the depth of a page and sense and output pieces of data respectively stored in the two halves of the page. In some cases, the number of first page buffers 111 may be the same as the number of second page buffers 112.

For example, the number of bits of the data that the first sense latch SL1 sensed from the first page PAG1 and stored may be substantially the same as the number of bits of the data that the second sense latch SL2 sensed from the second page PAG2 and stored. The number of bits of the data transmitted by the first cache latch CL1 to the data I/O circuit 150 may be substantially the same as the number of bits of the data transmitted by the second cache latch CL2 to the data I/O circuit 150.

As another example, time periods taken for the latches of the first page buffers 111 to sense, dump, and/or transmit data may be substantially the same as time periods taken for the latches of the second page buffers 112 respectively corresponding to the latches of the first page buffers 111 to sense, dump, and/or transmit data. For example, a time period taken for the first sense latch SL1 to sense data from the first page PAG1 and store the sensed data may be substantially the same as a time period taken for the second sense latch SL2 to sense data from the second page PAG2 and store the sensed data. A time period taken for the first cache latch CL1 to transmit data to the data I/O circuit 150 may be substantially the same as a time period taken for the second cache latch CL2 to transmit data to the data I/O circuit 150.

According to an exemplary embodiment of the inventive concept, the time period tDP1 taken to dump data from the first and second sense latches SL1 and SL2 to the first and second data latches DL1 and DL2 may be less than the time period tDP2 taken to dump data from the first data latch DL1 to the first cache latch CL1 or the time period tDP3 taken to dump data from the second data latch DL2 to the second cache latch CL2. This will be described in greater detail later with reference to FIGS. 12A and 12B.

Figure 12A:
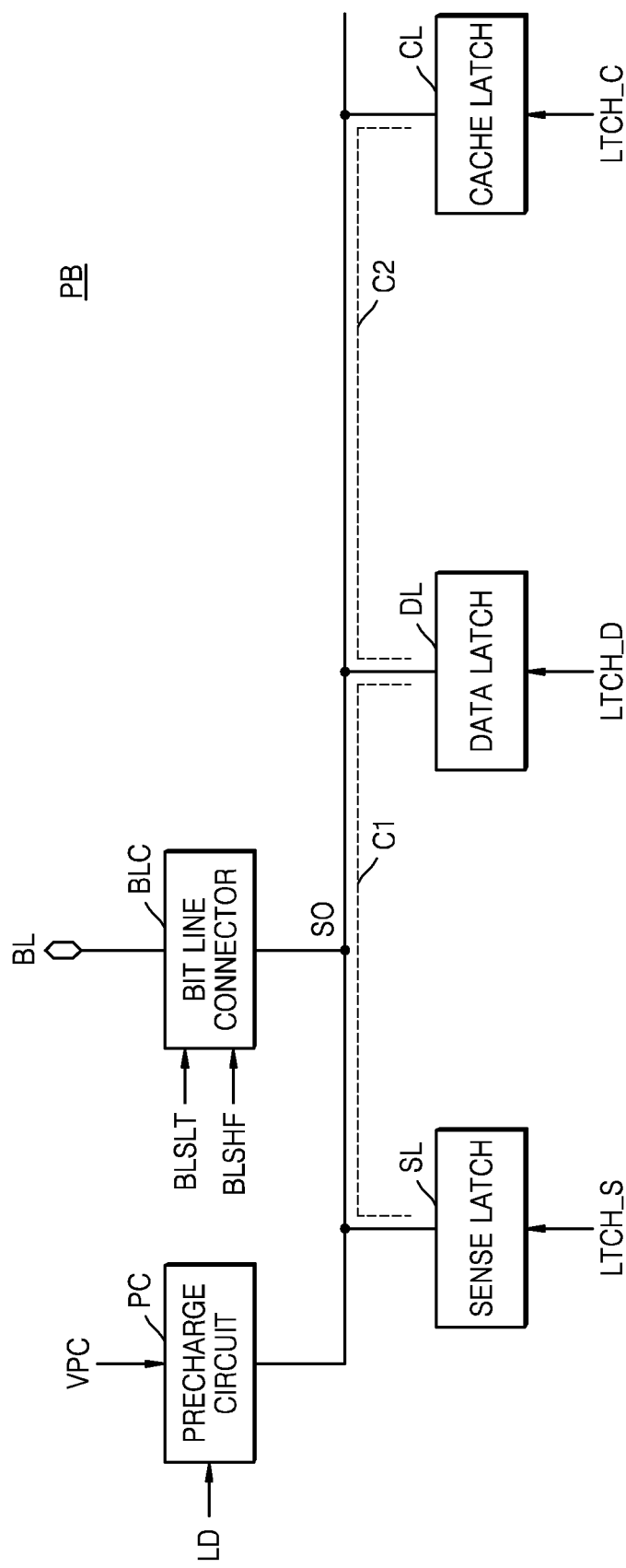
FIG. 12A is a block diagram of a page buffer according to an exemplary embodiment of the inventive concept.

FIG. 12A is a block diagram of a page buffer according to an exemplary embodiment of the inventive concept.

Referring to FIG. 12A, the page buffer PB may further include a bit line connector BLC and a precharge circuit PC in addition to the sense latch SL, the data latch DL, and the cache latch CL. Components included in the page buffer PB may be connected to one another via conductive lines branching from the sense out node SO.

During a read operation, the control logic unit 140 may precharge the bit line BL. For example, when a load signal LD and a control signal BLSHF are activated, the bit line BL may be precharged with a certain level VPC. In this case, the bit line connector BLC may maintain a turn on state according to a bit line select signal BLSLT. Thereafter, when the load signal LD is inactivated, a charge in the sense out node SO may flow to the bit line BL via the bit line connector BLC turned on according to the control signal BLSHF.

When a selected memory cell is an On Cell, the charge in the sense out node SO may be discharged to the common source line CSL of FIG. 2B via the bit line BL and a channel of a string. In this case, because a relatively large current flows from the sense out node SO to the bit line BL, a speed of a voltage drop of the sense out node SO is relatively high.

On the other hand, when the selected memory cell is an Off Cell, it may be difficult for the charge in the sense out node SO to be discharged to the common source line CSL via the bit line BL. Accordingly, because a relatively small current flows from the sense out node SO to the bit line BL, the speed of the voltage drop of the sense out node SO is relatively low.

The sense latch SL may sense a potential change of the sense out node SO and store data corresponding to the potential change. In other words, the sense latch SL may sense and store data of the selected memory cell via the bit line BL.

According to an exemplary embodiment of the inventive concept, the control logic unit 140 may transmit the sense latch control signal LTCH_S such that the data stored in the sense latch SL is dumped to the data latch DL. In this case, the sense latch SL may dump data to the data latch DL via a first current path C1. The control logic unit 140 may transmit the data latch control signal LTCH_D such that the data stored in the data latch DL is dumped to the cache latch CL. In this case, the data latch DL may dump data to the cache latch CL via a second current path C2.

According to an exemplary embodiment of the inventive concept, loading between the sense latch SL and the data latch DL may be smaller than loading between the data latch DL and the cache latch CL. For example, a distance of the first current path C1 may be less than a distance of the second current path C2. For example, the page buffer PB may be designed such that a separation distance between the sense latch SL and the data latch DL may be less than a separation distance between the data latch DL and the cache latch CL. Because loading between the sense latch SL and the data latch DL is small, a time period (for example, tDP1 of FIG. 11) taken for data to be dumped from the sense latch SL to the data latch DL may be relatively short. In detail, because the distance of the first current path C1 is less than the distance of the second current path C2, a time period (e.g., tDP1 of FIG. 11) taken for the sense latch SL to dump data to the data latch DL may be less than a time period (e.g., tDP2 of FIG. 11) taken for the data latch DL to dump data to the cache latch CL.

According to an exemplary embodiment of the inventive concept, when the distance of the first current path C1 is less than the distance of the second current path C2, an overall time period taken for the page buffer circuit 110 to perform dumping may be reduced.

Referring back to FIGS. 10 and 11, when loading between the first and second sense latches SL1 and SL2 and the first and second data latches DL1 and DL2 is designed to be small, the time period tDP1 taken to dump data from the first and second sense latches SL1 and SL2 to the first and second data latches DL1 and DL2 may be reduced by a certain reduction time period of Δdt. For example, a time period taken for the first sense latch SL1 to perform the dumping operation DP1a may be tDP1−Δdt. On the other hand, the time period tDP2 taken to dump data from the first data latch DL1 to the first cache latch CL1 may be increased by a first increase time period Δit1, and the time period tDP3 taken to dump data from the second data latch DL2 to the second cache latch CL2 may be increased by a second increase time period Δit2.

Figure 12B:
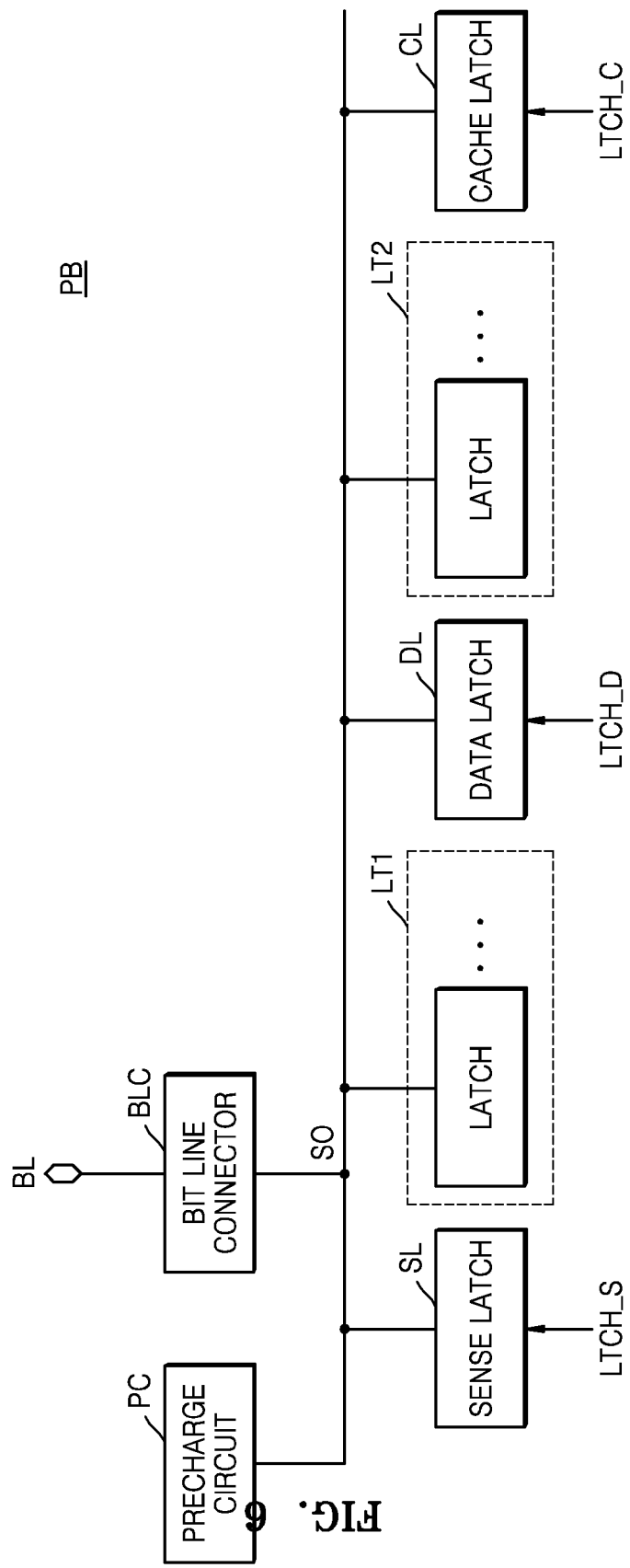
FIG. 12B is a block diagram of a page buffer according to an exemplary embodiment of the inventive concept.

FIG. 12B is a block diagram of a page buffer according to an exemplary embodiment of the inventive concept.

According to an exemplary embodiment of the inventive concept, the page buffer PB may further include a plurality of first latches LT1 and a plurality of second latches LT2 in addition to the components of FIG. 12A. Referring to FIG. 12B, the sense latch SL, the plurality of first latches LT1, the data latch DL, the plurality of second latches LT2, and the cache latch CL may be sequentially connected to the sense out node SO in parallel, and the number of first latches LT1 may be greater than the number of second latches LT2.

The page buffer PB may include a plurality of latches as necessary. When a latch to be used as the data latch DL is selected from the plurality of latches, the separation distance between the sense latch SL and the data latch DL and the separation distance between the data latch DL and the cache latch CL may be considered. Similar to the description given above with reference to FIG. 12A, the time period tDP1 taken for the sense latch SL to dump data to the data latch DL may be reduced, and thus the time period tDP2 taken to the data latch DL to dump data to the cache latch CL, namely, a hidden time period not added into the overall dumping time period, may be increased. Accordingly, the time period taken for the page buffer circuit 110 to dump data may be reduced.

Figure 13:
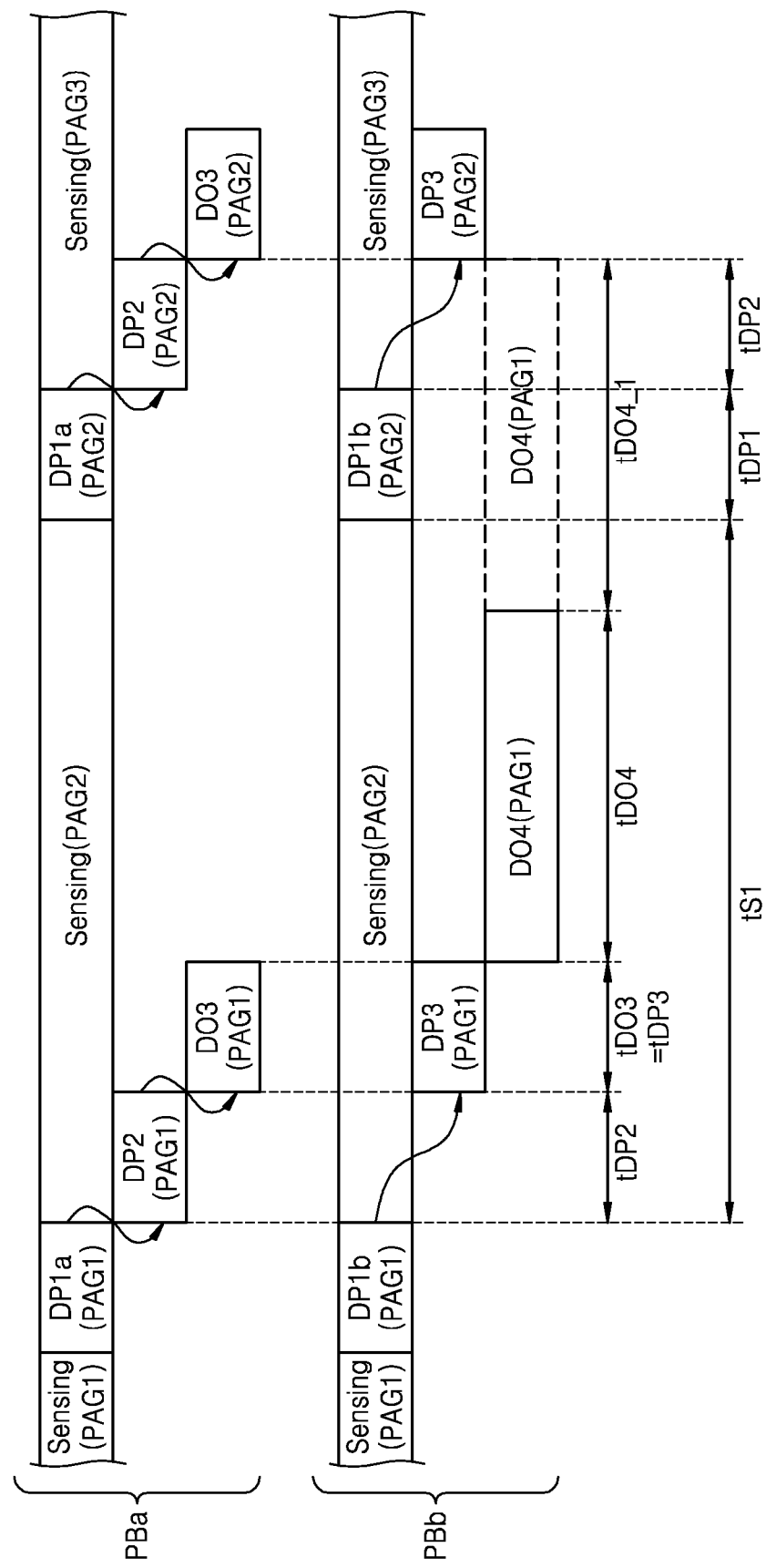
FIGS. 13 and 14 are data flow diagrams for explaining operations of a first page buffer and a second page buffer, according to an exemplary embodiment of the inventive concept.
Figure 14:
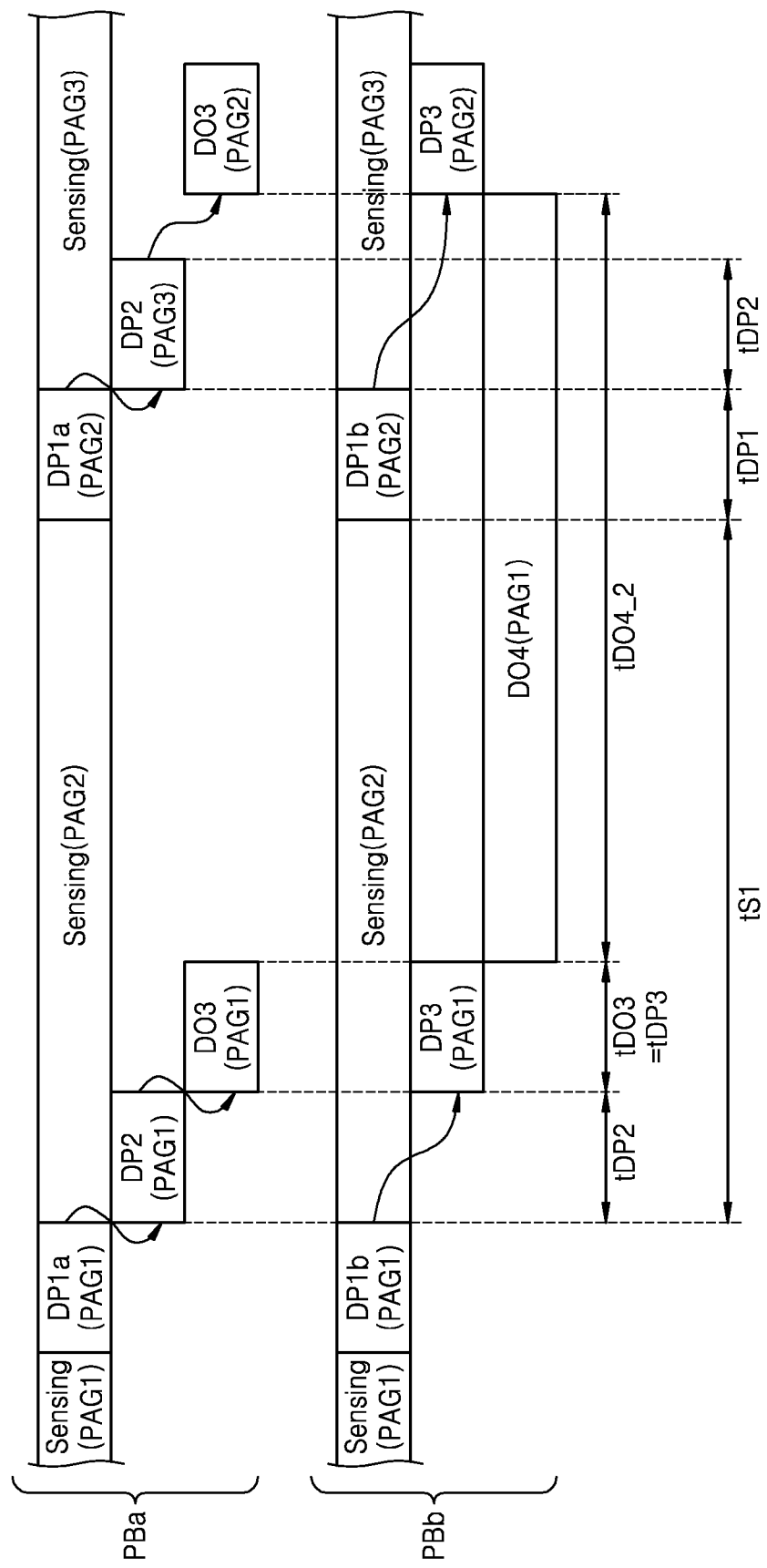

FIGS. 13 and 14 are data flow diagrams for explaining operations of a first page buffer and a second page buffer, according to an exemplary embodiment of the inventive concept.

Referring to FIG. 13, the time period tDO3 taken for the first cache latch CL1 to transmit data to the data I/O circuit 150 may be substantially equal to the time period tDP3 taken for the second data latch DL2 to dump data to the second cache latch CL2. In other words, the time period tDO3 taken for the first page buffer PBa to output data to the data I/O circuit 150 may be substantially equal to the time period tDP3 taken for the second data latch DL2 to perform dumping. Accordingly, in contrast with the case of FIG. 11, immediately after the operation (DP3) in which the second data latch DL2 dumps data to the second cache latch CL2 is completed, the second cache latch CL2 may transmit (DO4) the data to the data I/O circuit 150.

According to an exemplary embodiment of the inventive concept, a time period taken for the second cache latch CL2 to output data to the data I/O circuit 150 may be the time period tDO4. The time period tDO4 may be less than a comparative time period.

The comparative time period may refer to a time period obtained by subtracting the time period tDP2 taken to dump the data of the first page PAG1 from the first data latch DL1 to the first cache latch CL1 and the time period tDP3 taken to dump data from the second data latch DL2 to the second cache latch CL2 from a sum of a time period tS1 taken to sense the second page PAG2, the time period tDP1 taken to dump data, and the time period tDP2 taken to dump the data of the second page PAG2 from the first data latch DL1 to the first cache latch CL1. For example, the time period tDP2 taken to dump the data of the second page PAG2 to the first cache latch CL1 may be equal to the time period tDP2 taken to dump the data of the first page PAG1 to the first cache latch CL1. In this case, the comparative time period may be obtained by summing the time period tS1 and the time period tDP1 and subtracting the time period tDP3 from a result of the summation. For example, the comparative time period may be expressed as tS1+tDP1−tDP3. In this case, the time period tDP1 taken to dump data may be a time period taken to dump data from the first sense latch SL1 to the first data latch DL1 or a time period taken to dump data from the second sense latch SL2 to the second data latch DL2. For example, time periods taken for the first and second sense latches SL1 and SL2 to perform dumping, respectively, may be identical with each other.

Before the second page buffer PBb senses all of the data of the second page PAG2, the second page buffer PBb may complete the operation (DO4) of transmitting data from the second cache latch CL2 to the data I/O circuit 150.

According to an exemplary embodiment of the inventive concept, a time period taken for the second cache latch CL2 to transmit data to the data I/O circuit 150 may be a sum of the time period tDO4 and a time period tDO4_1 according to a size of output data. The sum of the time period tDO4 and the time period tDO4_1 may be equal to the comparative time period. When expressed by way of a formula, the sum of the time period tDO4 and the time period tDO4_1 may be expressed as tDO4+tDO4_1=tS1+tDP1−tDP3. As described above, the time period tDO3 taken for the first page buffer PBa to output data to the data I/O circuit 150 may be substantially equal to the time period tDP3 taken for the second data latch DL2 to perform dumping. Accordingly, the formula may be expressed differently as tDO3+tDO4+tDO4_1=tS1+tDP1.

Referring to FIG. 14, a time period taken for the second cache latch CL2 to transmit data may be a time period tDO4_2. In this case, the time period tDO4_2 may be greater than the comparative time period.

Referring back to FIG. 13, at the moment when the operation (DP2) in which the first data latch DL1 dumps the data of the second page PAG2 to the first cache latch CL1 has been completed, the operation (DO4) in which the second cache latch CL2 transmits the data of the first page PAG1 may be completed. Alternatively, before the operation (DP2) in which the first data latch DL1 dumps the data of the second page PAG2 to the first cache latch CL1 is completed, the operation (DO4) in which the second cache latch CL2 transmits the data of the first page PAG1 may be completed.

Referring to FIG. 14, at the moment when or after the operation (DP3) in which the second data latch DL2 dumps data to the second cache latch CL2 has been completed, the operation DO3 in which the first cache latch CL1 transmits the data to the data I/O circuit 150 may be completed.

Figure 15A:
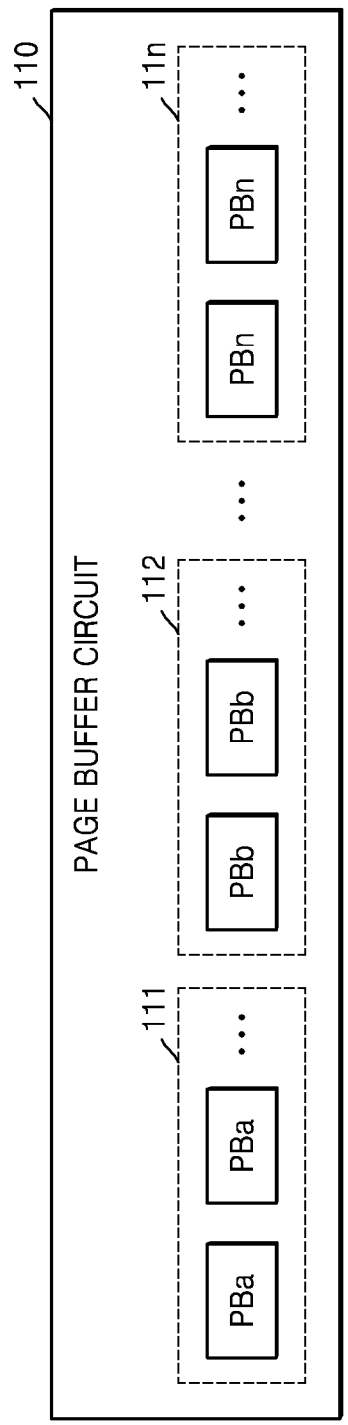
FIG. 15A is a block diagram of a page buffer circuit according to an exemplary embodiment of the inventive concept.

FIG. 15A is a block diagram of a page buffer circuit according to an exemplary embodiment of the inventive concept.

Referring to FIG. 15A, the page buffer circuit 110 may include a plurality of first page buffers 111, a plurality of second page buffers 112, through to a plurality of n-th page buffers 11n. For example, the first page buffers 111 may include some of the plurality of page buffers PB1 through PBm of FIG. 1, the second page buffers 112 may include some of the plurality of page buffers PB1 through PBm of FIG. 1, and the n-th page buffers 11n may include some of the plurality of page buffers PB1 through PBm of FIG. 1, where n may be a positive number greater than 2.

According to an exemplary embodiment of the inventive concept, first, second, and n-th page buffers PBa, PBb, and PBn included in the page buffer circuit 110 may operate in correspondence to one plane PL. For example, each first page buffer PBa, each second page buffer PBb, and each n-th page buffer PBn may operate to read data out of the same plane (for example, the first plane PL1 of FIG. 2D).

According to an exemplary embodiment of the inventive concept, the first page buffers 111 may be connected to a plurality of bit lines BLx of the first plane PL1, the second page buffers 112 may be connected to a plurality of bit lines BLy of the first plane PL1, and the n-th page buffers 11n may be connected to a plurality of bit lines BLz of the first plane PL1. In other words, the first page buffer PBa may be connected to each bit line BLx, the second page buffer PBb may be connected to each bit line BLy, and the n-th page buffer PBn may be connected to each bit line BLz.

FIG. 15B is a block diagram for explaining page buffers included in the page buffer circuit of FIG. 15A according to an exemplary embodiment of the inventive concept. A description of FIG. 15B that is the same as given above with reference to FIG. 10 will not be repeated herein.

Referring to FIG. 15B, the first page buffer PBa may include a first sense latch SL1, a first data latch DL1, and a first cache latch CL1, the second page buffer PBb may include a second sense latch SL2, a second data latch DL2, and a second cache latch CL2, and the n-th page buffer PBn may include an n-th sense latch SLn, an n-th data latch DLn, and an n-th cache latch CLn, where n may be a positive number greater than 2.

According to an exemplary embodiment of the inventive concept, the first, second, and n-th page buffers PBa, PBb, and PBn included in the page buffer circuit 110 may read pieces of data from an identical plane. For example, the first page buffer PBa may sense and read data from some bit lines BLx connected to the plane, the second page buffer PBb may sense and read data from some bit lines BLy connected to the plane, and the n-th page buffer PBn may sense and read data from some bit lines BLz connected to the plane.

According to an exemplary embodiment of the inventive concept, data dumping from the data latch DL to the cache latch CL may be performed three or more times. For example, the first data latch DL1 may perform the data dumping DP2 to the first cache latch CL1, the second data latch DL2 may perform the data dumping DP3 to the second cache latch CL2, and the n-th data latch DLn may perform data dumping DPn to the n-th cache latch CLn. Some of the first through n-th data latches DL1 through DLn may perform dumping, because during random reading, only some of the pieces of data stored in the plane may be read.

Figure 15C:
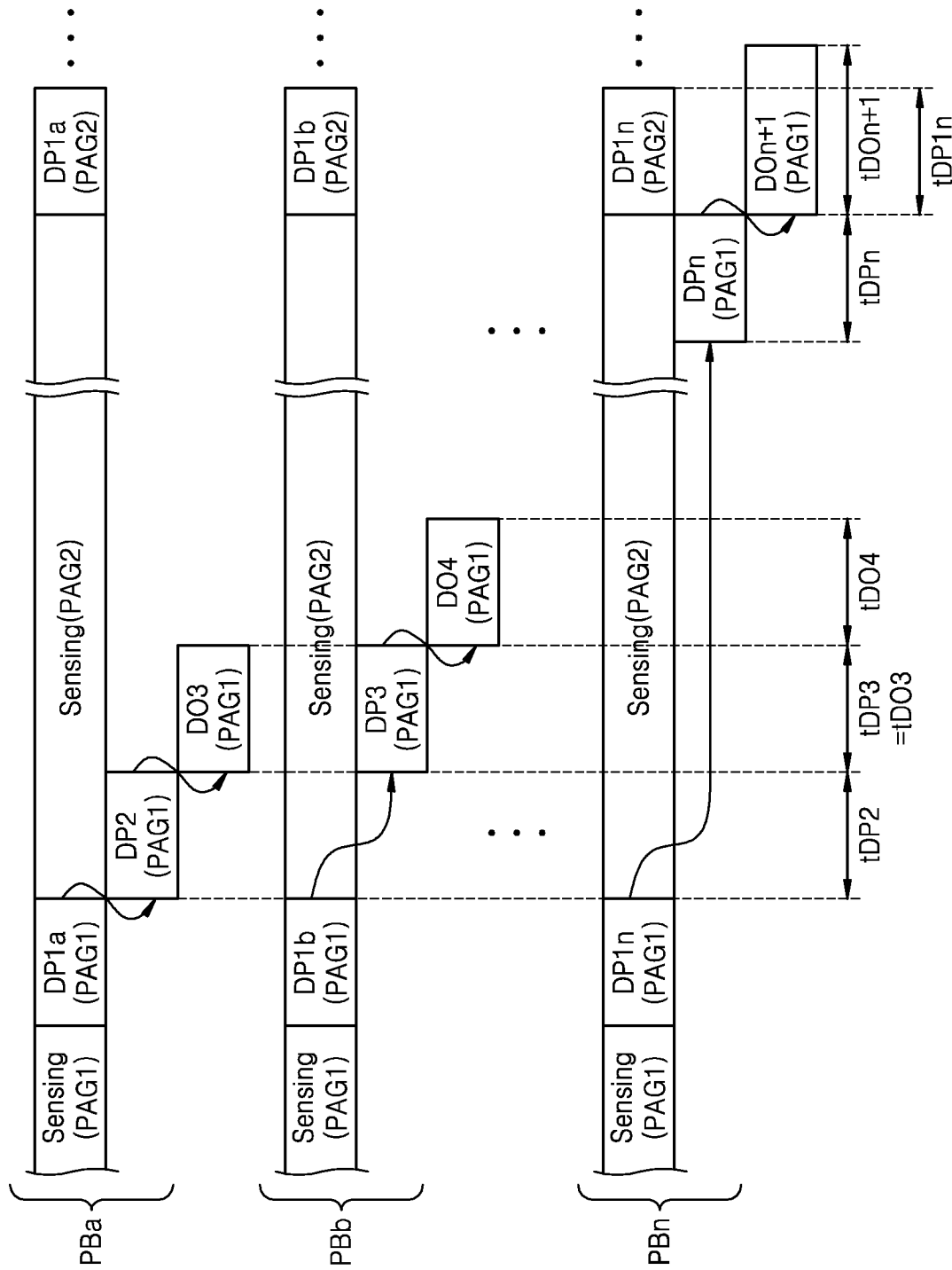
FIG. 15C is a data flow diagram for explaining operations of the page buffers of FIG. 15B according to an exemplary embodiment of the inventive concept.

FIG. 15C is a data flow diagram for explaining operations of the page buffers of FIG. 15B according to an exemplary embodiment of the inventive concept.

Referring to FIGS. 15B and 15C, the first through n-th sense latches SL1 through SLn included in the first through n-th page buffers PBa through PBn may sense the data of the first page PAG1 and may dump (DP1) the sensed data to the first through n-th data latches DL1 through DLn.

According to an exemplary embodiment of the inventive concept, the first data latch DL1 may dump (DP2) data to the first cache latch CL1. Thereafter, while the first cache latch CL1 is transmitting (DO3) the data to the data I/O circuit 150, the second data latch DL2 may dump (DP3) data to the second cache latch CL2. In other words, while the first page buffer PBa is outputting (DO3) data, the second page buffer PBb may dump (DP3) data. In other words, while a k-th cache latch included in a k-th page buffer is transmitting data, a (k+1)th data latch included in a (k+1)th page buffer may dump data, where k may be an integer ranging from 1 to n−1.

According to an exemplary embodiment of the inventive concept, when the second cache latch CL2 transmits the entire data (DO4), the n-th data latch DLn may dump the data of the first page PAG1 to the n-th cache latch CLn (DPn). Thereafter, while the n-th cache latch CLn is transmitting (DOn+1) the data of the first page PAG1 to the data I/O circuit 150, the n-th sense latch SLn may dump (DP1n) the data of the second page PAG2 to the n-th data latch DLn.

According to an exemplary embodiment of the inventive concept, a time period tDP2 taken for the first data latch DL1 to dump data to the first cache latch CL1, a time period tDP3 taken for the second data latch DL2 to dump data to the second cache latch CL2, a time period tDO3 taken for the first cache latch CL1 to transmit data to the data I/O circuit 150, and a time period tDO4 taken for the second cache latch CL2 to transmit data to the data I/O circuit 150 may be substantially the same as each other.

Alternatively, time periods taken for the first through n-th data latches DL1 through DLn to dump data to the first through n-th cache latches CL1 through CLn may be substantially the same as time periods taken for the first through n-th cache latches CL1 through CLn to transmit data to the data I/O circuit 150. For example, the time period tDP2, the time period tDP3, the time period tDO3, the time period tDO4, through to time periods tDPn and tDOn+1 may be substantially the same as each other.

Referring to FIG. 15C, a time point when the first through n-th page buffers PBa through PBn transmitted the entire data of the first page PAG1 to the data I/O circuit 150 (e.g., a time point when the transmit operation DOn+1 has been completed) may be later than a time point when the data of the second page PAG2 was transmitted to the data latch DL (e.g., at least one of the dumping operations DP1a through DP1n).

However, in contrast with the above example, the time point when the first through n-th page buffers PBa through PBn transmitted the entire data of the first page PAG1 to the data I/O circuit 150 (e.g., the time point when the transmit operation DOn+1 has been completed) may be substantially the same as the time point when the data of the second page PAG2 was transmitted to the data latch DL (e.g., at least one of the dumping operations DP1a through DP1n).

According to an exemplary embodiment of the inventive concept, a time point when the first data latch DL1 terminates the dumping operation DP2 may be substantially the same as a time point when the second data latch DL2 starts the dumping operation DP3. Alternatively, the time point when the first data latch DL1 terminates the dumping operation DP2 may be a time point before or after the second data latch DL2 starts the dumping operation DP3.

Figure 16:
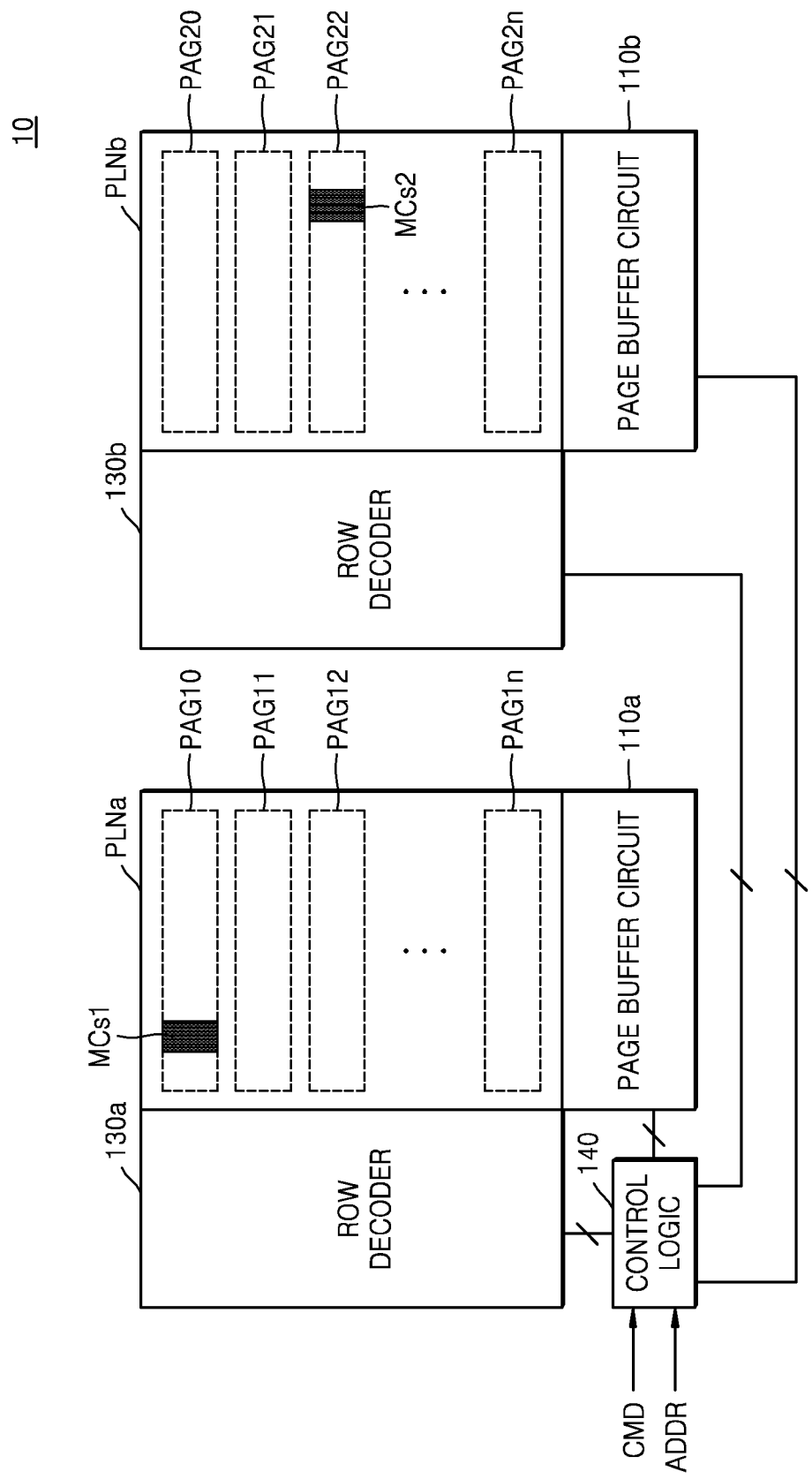
FIG. 16 is a block diagram for explaining a non-volatile memory device according to an exemplary embodiment of the inventive concept.

FIG. 16 is a block diagram for explaining a non-volatile memory device according to an exemplary embodiment of the inventive concept.

Referring to FIG. 16, the non-volatile memory device 10 may include a plurality of planes PLNa and PLNb including a plurality of pages PAG10 through PAG1n and PAG20 through PAG2n, a plurality of page buffer circuits, namely, the first and second page buffer circuits 110a and 110b, a plurality of row decoders 130a and 130b, and the control logic unit 140, where the plurality of pages PAG10 through PAG1n and PAG20 through PAG2n include a plurality of memory cells.

The planes PLNa and PLNb each denote a memory cell array connected to a single page buffer circuit 110 that operates independently. For example, the first plane PLNa may be a memory cell array connected to the first page buffer circuit 110a. The second plane PLNb may be a memory cell array connected to the second page buffer circuit 110b.

The non-volatile memory device 10 may perform a read operation in units of pages PAG included in a connected plane. For example, in response to the command CMD and the address ADDR instructing a random read operation, the control logic unit 140 may read data from at least one of the memory cells included in at least one page PAG (for example, at least one of memory cells MCs1 and MCs2). In detail, the control logic unit 140 may control the first page buffer circuit 110a and the second page buffer circuit 110b such that the first page buffer circuit 110a senses data from the first plane PLNa and the second page buffer circuit 110b senses data from the second plane PLNb.

A random read operation may denote an operation of reading pieces of data stored sporadically in at least one memory cell included in at least one page PAG. An operation of the page buffer circuit 110 when the non-volatile memory device 10 performs a random read operation will now be described in detail.

Figure 17:
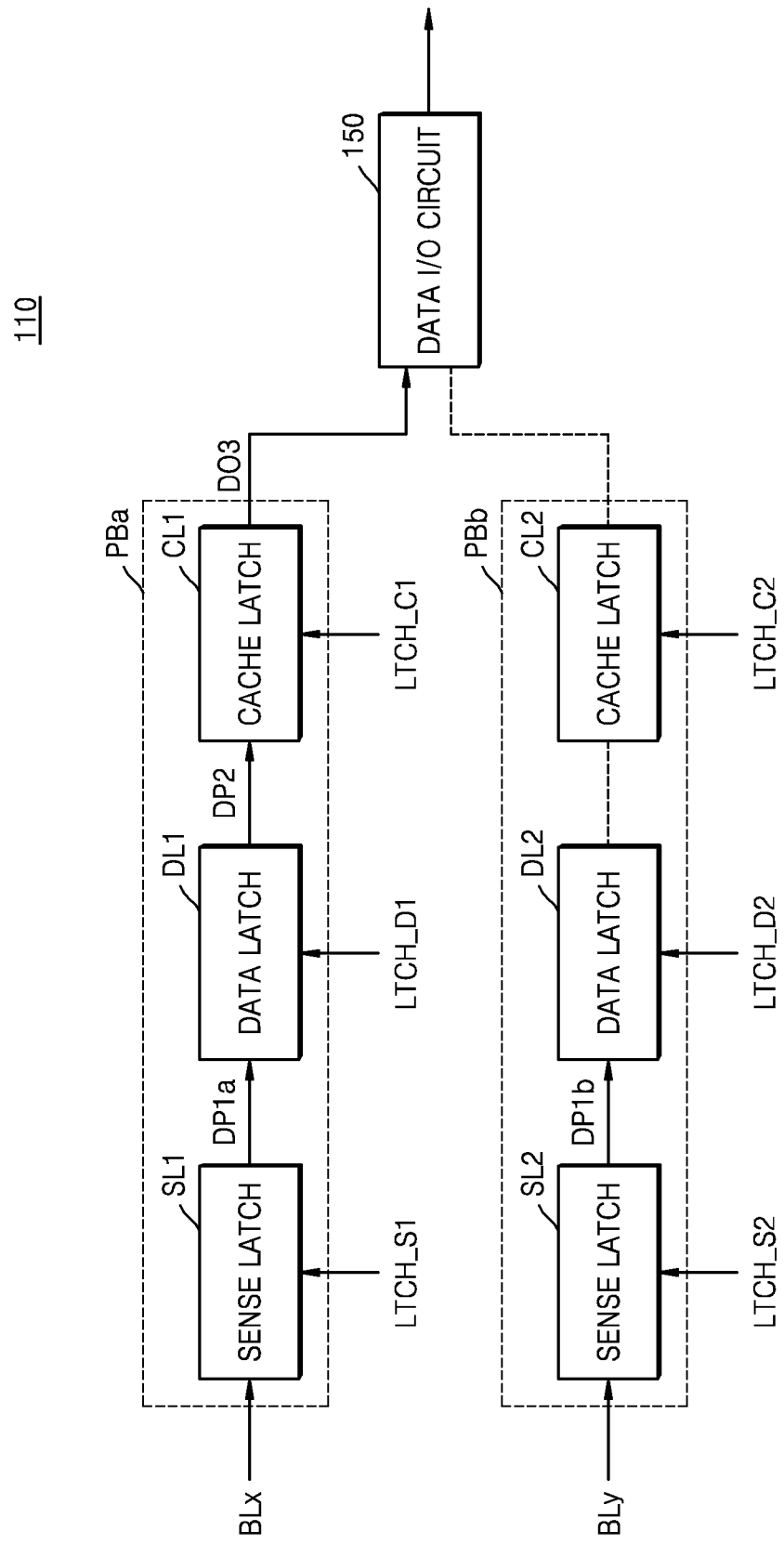
FIG. 17 is a block diagram for explaining first page buffers and second page buffers, according to an exemplary embodiment of the inventive concept.
Figure 18:
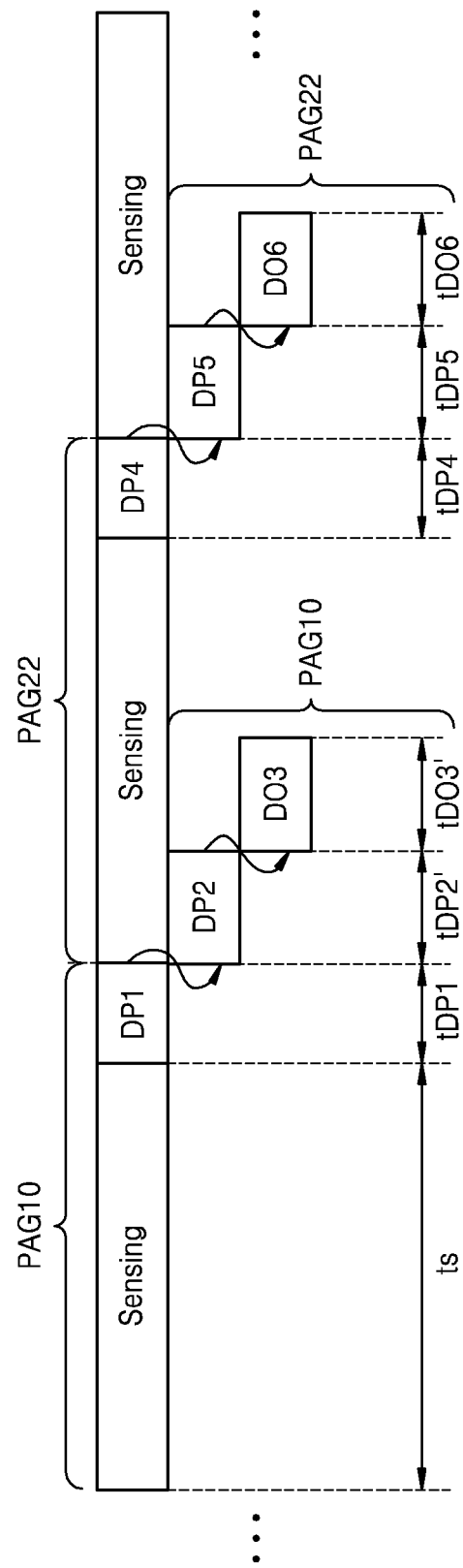
FIG. 18 is a data flow diagram for explaining operations of the first page buffers and the second page buffers of FIG. 17, according to an exemplary embodiment of the inventive concept.

FIG. 17 is a block diagram for explaining first page buffers and second page buffers according to an exemplary embodiment of the inventive concept, and FIG. 18 is a data flow diagram for explaining operations of the first page buffers and the second page buffers of FIG. 17, according to an exemplary embodiment of the inventive concept.

Referring to FIGS. 17 and 18, the first and second page buffers PBa and PBb may perform a random read operation on the data stored in the plane in units of pages PAG. A bit line BLx and a bit line BLy may be bit lines intersecting with the same word line. The first page buffer PBa and the second page buffer PBb may operate together to read the data of the same page (for example, a page PAG10 of FIG. 16).

As described above with reference to FIG. 16, in a random read operation, only the data stored in some memory cells is read from one page, and the data stored in the remaining memory cells do not need to be read from the page. Referring to FIG. 16, for example, the data stored in some memory cells MCs1 from among the plurality of memory cells included in the page PAG10 may be read, and the data stored in the remaining memory cells may not be read. In this case, the bit line BLx of FIG. 17 may be one of the bit lines connected to the some memory cells MCs1, and the bit line BLy may be one of the bit lines connected to the remaining memory cells. Accordingly, the control logic unit 140 may control the first page buffer PBa to sense data via the bit line BLx and output the sensed data, and the control logic unit 140 may control the second page buffer PBb not to output data sensed via the bit line BLy.

Referring to FIG. 10, the control logic unit 140 may control the page buffer circuit 110 such that the first and second sense latches SL1 and SL2 respectively included in the first page buffer PBa and the second page buffer PBb sense voltages from a plurality of bit lines of the same page PAG and dump data to first and second data latches DL1 and DL2.

According to an exemplary embodiment of the inventive concept, the control logic unit 140 may transmit the first data latch control signal LTCH_D1 for controlling the first data latch DL1 to dump (DP2) data to the first cache latch CL1, based on a command and an address instructing a random read operation. The control logic unit 140 may also transmit the second data latch control signal LTCH_D2 for controlling the second data latch DL2 not to dump data to the second cache latch CL2.

For example, the control logic unit 140 may identify memory cells having to-be-read data stored therein (for example, the memory cells MCs1 of FIG. 16) to perform a random read operation on memory cells included in a page (for example, the page PAG10 of FIG. 16), based on the address ADDR. The control logic unit 140 may determine the data stored in the identified memory cells (for example, the memory cells MCs1 of FIG. 16) to be data corresponding to the data that is to be dumped from the first data latch DL1 to the first cache latch CL1. The control logic unit 140 may transmit the first data latch control signal LTCH_D1 such that the data stored in the first data latch DL1 is dumped to the first cache latch CL1 (DP2).

The control logic unit 140 may also identify memory cells having stored therein data that is not to be read via a random read operation, from among the memory cells included in a page (for example, the page PAG10 of FIG. 16), based on the address ADDR. The control logic unit 140 may also transmit the second data latch control signal LTCH_D2 so that the data stored in the identified memory cells is not dumped from the second data latch DL2 to the second cache latch CL2. In detail, the control logic unit 140 may transmit only the second data latch control signal LTCH_D2 instructing storage of data dumped by the second sense latch SL2, and then the control logic unit 140 may not transmit the second data latch control signal LTCH_D2 instructing dumping of data to the second cache latch CL2.

Referring to FIG. 18, based on the sense latch control signal LTCH_S, the first and second sense latches SL1 and SL2 may sense and store the data of an x-th page PAGx and may dump the stored data (DP1). Based on the first data latch control signal LTCH_D1, the first data latch DL1 may dump the stored data (DP2). Based on the first cache latch control signal LTCH_C1, the first cache latch CL1 may transmit data to the data I/O circuit 150 (DO3).

According to an exemplary embodiment of the inventive concept, when the non-volatile memory device 10 performs a random read operation, an overall time period taken for the page buffer circuit 110 to perform dumping may be reduced. A sequential read operation and a random read operation will now be compared and described with reference to FIGS. 11 and 18.

Referring to FIG. 11, a time period taken for the page buffer circuit 110 to sense data and output the sensed data to the data I/O circuit 150 when the non-volatile memory device 10 performs a sequential read operation will be referred to as a first time period. In this case, the second time period is the same as a sum of the time period tS, the time period tDP1, the time period tDP2, the time period tDO3, and the time period tDO4. Referring to FIG. 18, a time period taken for the page buffer circuit 110 to sense data and output the sensed data to the data I/O circuit 150 when the non-volatile memory device 10 performs a random read operation will be referred to as a second time period. In this case, the first time period is the same as a sum of the time period tS, the time period tDP1, the time period tDP2', and the time period tDO3'.

The time periods tS of FIGS. 11 and 18 are substantially the same as each other and the time periods tDP1 of FIGS. 11 and 18 are substantially the same as each other, because, the first and second sense latches SL1 and SL2 sensing the data of one page PAG in a sequential read operation are identical to those in a random read operation and the first and second sense latches SL1 and SL2 dumping the entirety of the stored data to the first and second data latches DL1 and DL2 in a sequential read operation are identical to those in a random read operation.

However, in the case of the first time period during which the non-volatile memory device 10 is performing a sequential read operation, the time period tDO4 may be additionally taken. In other words, in a random read operation, compared with a sequential read operation, the time period tDO4 taken for the second cache latch CL2 to output data may be reduced. The time period tDP2' and the time period tDO3' of FIG. 18 may be relatively shorter than the time periods tDP2 and tDO3 of FIG. 11, respectively. Accordingly, the control logic unit 140 may control the second data latch DL2 to selectively dump data to the second cache latch CL2.

The non-volatile memory device 10 according to an exemplary embodiment of the inventive concept may sense and output data of different pages PAG.

Referring to FIGS. 16 and 18, the control logic unit 140 may control the first page buffer circuit 110a to output the data stored in the some memory cells MCs1 included in the page PAG10, and may control the second page buffer circuit 110b to output the data stored in the some memory cells MCs2 included in the page PAG22. Because the page PAG10 and the page PAG22 are included in different planes PLN, the first page buffer circuit 110a and the second page buffer circuit 110b, being different page buffer circuits 110, may read data independently. Thus, when the control logic unit 140 senses pages (for example, the pages PAG10 and PAG22) of different planes PLN in parallel to perform a random read operation, the control logic unit 140 may reduce a time period taken for sensing. An address queuing operation that is performed by the control logic unit 140 to sense pages in parallel will now be described in detail.

Figure 19:
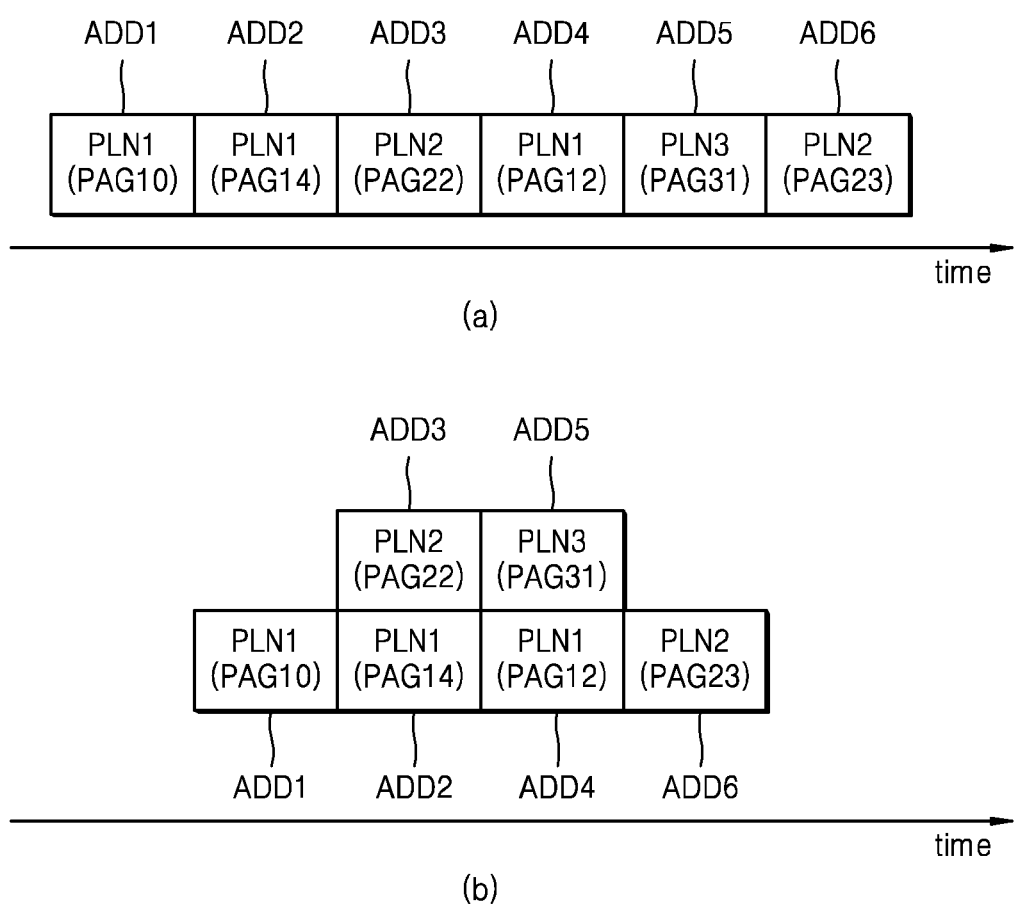
FIG. 19 is a diagram for explaining an address queuing operation that is performed by a control logic unit, according to an exemplary embodiment of the inventive concept.

FIG. 19 is a diagram for explaining an address queuing operation that is performed by a control logic unit, according to an exemplary embodiment of the inventive concept. FIG. 19(a) illustrates a plurality of addresses, namely, first through sixth addresses ADD1 through ADD6, received by the control logic unit 140 when the non-volatile memory device 10 performs a random read operation, and FIG. 19(b) illustrates queuing of the first through sixth addresses ADD1 through ADD6 received by the control logic unit 140. The address ADDR may include the first through sixth addresses ADD1 through ADD6.

Referring to FIG. 19, the first address ADD1 indicates that data to be read has been stored in a page PAG10 of a first plane PLN1, the second address ADD2 indicates that data to be read has been stored in a page PAG14 of the first plane PLN1, and the third address ADD3 indicates that data to be read has been stored in a page PAG22 of a second plane PLN2.

According to an exemplary embodiment of the inventive concept, when the non-volatile memory device 10 performs a random read operation, the control logic unit 140 may sequentially receive the first through sixth addresses ADD1 through ADD6. When two received addresses ADDR indicate the same plane PLN, the control logic unit 140 performs serial queuing, and, when two received addresses ADDR indicate different planes PLN, the control logic unit 140 performs parallel queuing. The serial queuing denotes an operation of sequentially reading data indicated by the address ADDR, and the parallel queuing denotes an operation of reading data indicated by the address ADDR at substantially the same time. Because data is read at substantially the same time in the parallel queuing, the parallel queuing may be expressed as merging of the addresses of different memory planes.

Referring to FIG. 19(a), the control logic unit 140 may sequentially receive the first address ADD1 and the second address ADD2 both indicating the first plane PLN1. In this case, as shown in FIG. 19(b), the control logic unit 140 may serially queue the first address ADD1 and the second address ADD2. After the control logic unit 140 receives the second address ADD2 indicating the first plane PLN1, the control logic unit 140 receives the third address ADD3 indicating the second plane PLN2. In this case, as shown in FIG. 19(b), the control logic unit 140 may queue the second address ADD2 and the third address ADD3 in parallel, because the second address ADD2 and the third address ADD3 indicate different planes PLN.

According to an exemplary embodiment of the inventive concept, the control logic unit 140 may control at least one page buffer circuit 110 to sense the data stored in a plane PLN, based on queued addresses. For example, when the control logic unit 140 receives the second address ADD2 and the third address ADD3 indicating different planes PLN, respectively, the control logic unit 140 may control the first page buffer circuit 110a to sense the data stored in the first plane PLN1 indicated by the second address ADD2, and may control the second page buffer circuit 110b to sense the data stored in the second plane PLN2 indicated by the third address ADD3.

In detail, based on the second address ADD2 from among queued addresses, the control logic unit 140 may transmit the sense latch control signal LTCH_S such that a plurality of sense latches included in the first page buffer circuit 110a may sense pieces of data stored in a page PAG14. Based on the third address ADD3 from among queued addresses, the control logic unit 140 may transmit the sense latch control signal LTCH_S such that a plurality of sense latches included in the second page buffer circuit 110b may sense pieces of data stored in a page PAG22.

Accordingly, the non-volatile memory device 10 performing a random read operation may reduce the total number of sensing operations. For example, as in FIG. 19(a), when the control logic unit 140 controls the page buffer circuit 110 to sequentially perform sensing operations without queuing the received addresses in series or in parallel, the page buffer circuit 110 may require an overall time period of 6*tSE. In this case, tSE refers to a time period taken for sensing.

On the other hand, as in FIG. 19(b), when the control logic unit 140 queues the received addresses, the control logic unit 140 may control the first page buffer circuit 110a and the second page buffer circuit 110a included in the page buffer circuit 110 to perform sensing operations in parallel. Thus, the page buffer circuit 110 may require an overall time period of 4*tSE, and an overall sensing time may be reduced according to the parallel queuing.

Figure 20:
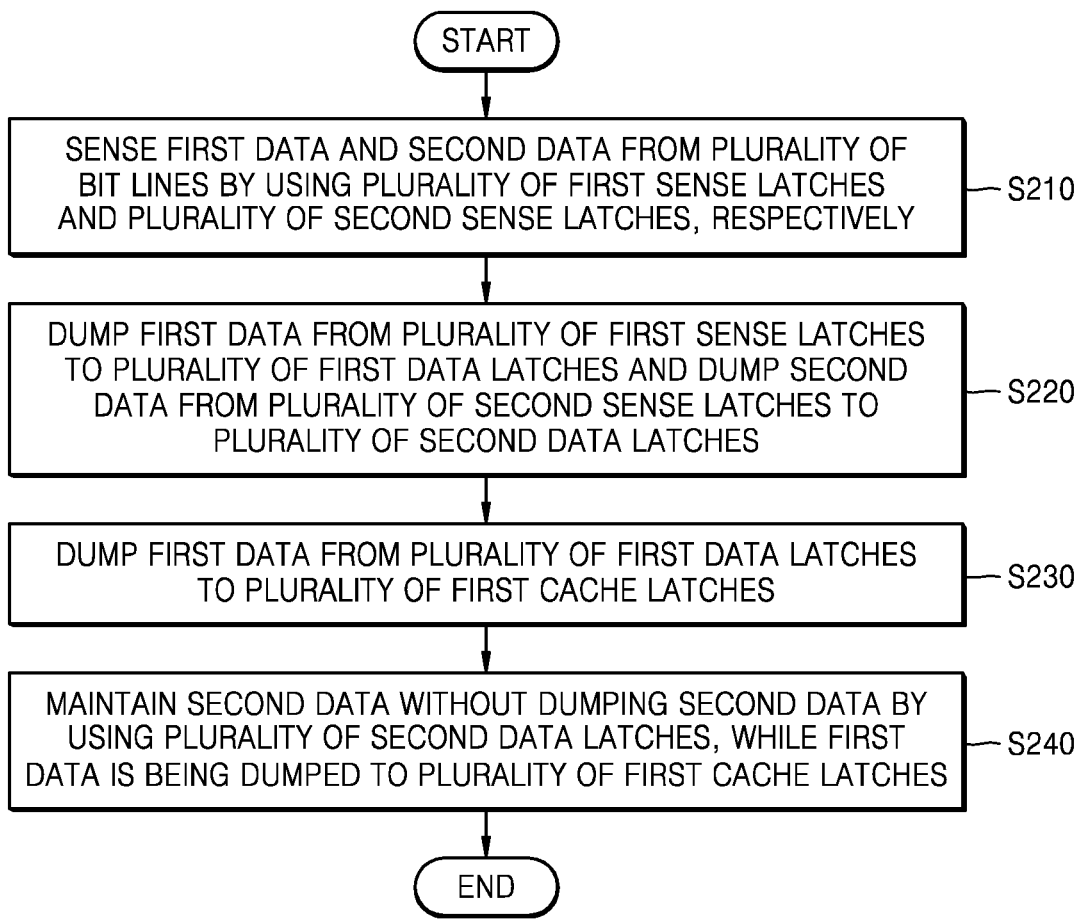
FIG. 20 is a flowchart of an operation of a page buffer circuit, according to an exemplary embodiment of the inventive concept.

FIG. 20 is a flowchart of an operation of a page buffer circuit, according to an exemplary embodiment of the inventive concept.

In operation S210, a plurality of first sense latches SL1 and a plurality of second sense latches SL2 may sense first data and second data from a plurality of bit lines, respectively.

For example, each of the first data and the second data may include data stored in a memory cell of a first page (for example, PAG1 of FIG. 11 or PAG10 of FIG. 16), the first data may include data stored in some memory cells (for example, MCs1 of FIG. 16) from among the data stored in the first page, and the second data may include the remaining data from among the data stored in the first page.

While the first data and the second data are being sensed, a plurality of third sense latches and a plurality of fourth sense latches sense third data and fourth data, respectively, from the plurality of bit lines. The first data and the second data may include the data stored in the memory cells of the first page (for example, PAG10 of FIG. 16), the third data and the fourth data may include the data stored in the memory cells of the second page (for example, PAG22 of FIG. 16), and the first page and the second page may be included in different planes (for example, PLNa and PLNb of FIG. 16).

In operation S220, the first data may be dumped from the plurality of first sense latches SL1 to a plurality of first data latches DL1, and the second data may be dumped from the plurality of second sense latches SL2 to a plurality of second data latches DL2.

In operation S230, the plurality of first data latches DL1 may dump the first data to a plurality of first cache latches CL1.

In operation S240, while the first data is being dumped to the plurality of first cache latches CL1, the plurality of second data latches DL2 may maintain the second data without dumping the second data.

Figure 21:
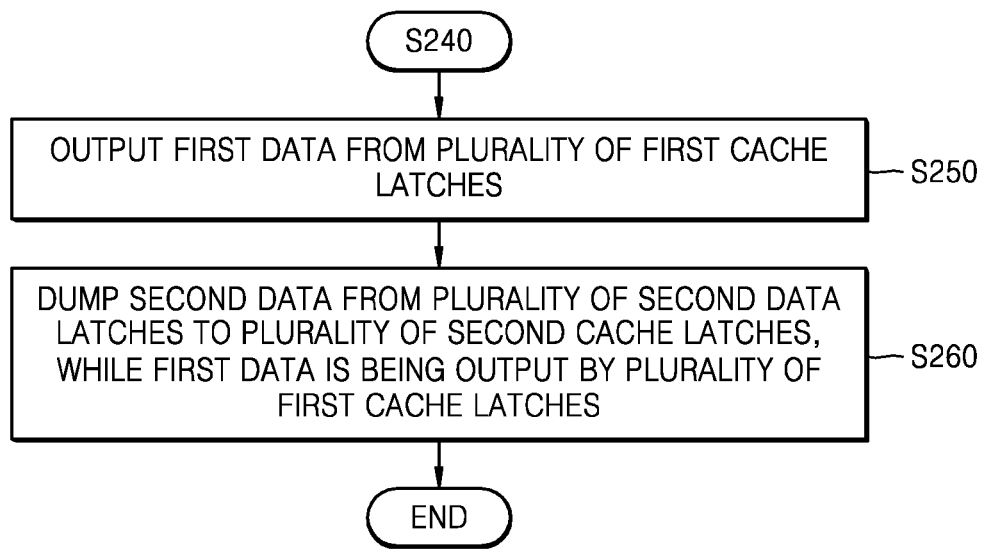
FIG. 21 is a flowchart of an operation of a page buffer circuit, according to an exemplary embodiment of the inventive concept.

FIG. 21 is a flowchart of an operation of a page buffer circuit, according to an exemplary embodiment of the inventive concept.

As described above with reference to FIG. 20, in operation S240, while the first data is being dumped to the plurality of first cache latches CL1, the plurality of second data latches DL2 may maintain the second data without dumping the second data. Operation S240 has already been described above with reference to FIG. 20, so a description thereof will be omitted here.

In operation S250, the plurality of first cache latches CL1 may output the first data.

In operation S260, while the first data is being output by the plurality of first cache latches CL1, the plurality of second data latches DL2 may dump the second data to a plurality of second cache latches CL2.

In this case, a time period taken for the plurality of first cache latches CL1 to output the first data may be longer than that taken for the plurality of second data latches DL2 to dump the second data to the plurality of second cache latches CL2. Because a time period taken to output data is longer than that taken to dump data within the same time zone or period, as described above with reference to FIG. 11, the time period tDP3 taken to perform dumping may be hidden by the time period tDO3 taken to perform outputting.

The second data may be dumped while third data stored in the second page is being sensed from the plurality of bit lines, and the first page and the second may be consecutive pages. In other words, the page buffer circuit may perform a sequential read operation. For example, referring to FIG. 11, while the data stored in the second page PAG2 is being sensed, the second data latch DL2 may dump (DP3) the sensed data to the second cache latch CL2 during the time period tDP3. The execution of sensing and dumping at substantially the same time may increase efficiency of a read operation.

Figure 22:
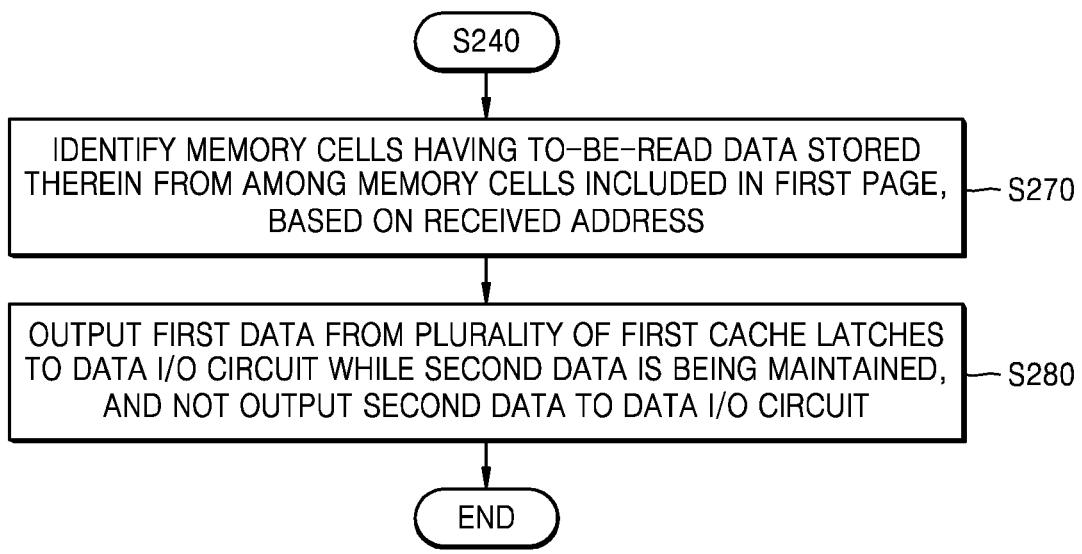
FIG. 22 is a flowchart of an operation of a page buffer circuit, according to an exemplary embodiment of the inventive concept.

FIG. 22 is a flowchart of an operation of a page buffer circuit, according to an exemplary embodiment of the inventive concept.

As described above with reference to FIG. 20, in operation S240, while the first data is being dumped to the plurality of first cache latches CL1, the plurality of second data latches DL2 may maintain the second data without dumping the second data. Operation S240 has already been described above with reference to FIG. 20, so a description thereof will be omitted here.

In operation S270, memory cells having to-be-read data stored therein (for example, the memory cells MCs1 of FIG. 16) from among the memory cells included in the first page (for example, the page PAG10 of FIG. 16) may be identified based on the received address ADDR.

In operation S280, while the second data is being maintained, the plurality of first cache latches CL1 may output the first data to the data I/O circuit 150 and may not output the second data to the data I/O circuit 150.

For example, referring to FIGS. 16 and 17, the first page buffer circuit PBa and the second page buffer circuit PBb may sense data of pages included in different planes. The first page buffer circuit PBa may include the first sense latches SL1 and the second sense latches SL2, and the second page buffer circuit PBb may include the third sense latches and the fourth sense latches. Functions of the first sense latches SL1 and the second sense latches SL2 are similar to those of the third sense latches and the fourth sense latches, respectively. While the first sense latches SL1 are sensing the first data and the second sense latches SL2 are sensing the second data, the third sense latches may sense the third data and the fourth sense latches may sense the fourth data. As described above, the first data and the second data may include the data stored in the memory cells of the first page (for example, PAG10 of FIG. 16), the third data and the fourth data may include the data stored in the memory cells of the second page (for example, PAG22 of FIG. 16), and the first page and the second page may be included in different planes (for example, PLNa and PLNb of FIG. 16).

The operation described above with reference to FIG. 22 may be performed when the control logic unit 140 performs address queuing. Referring to FIG. 19, the control logic unit 140 may perform parallel queuing such that the pieces of data stored in different planes (for example, PLN1 and PLN2 of FIG. 19) are sensed at the same time zone, and may perform serial queuing such that the same plane (for example, PLN1 of FIG. 19) is sensed at different time zones. Thus, the non-volatile memory device 10 performs sensing operations on different planes PLN at substantially the same time, thus improving the performance of a read operation.

Figure 23:
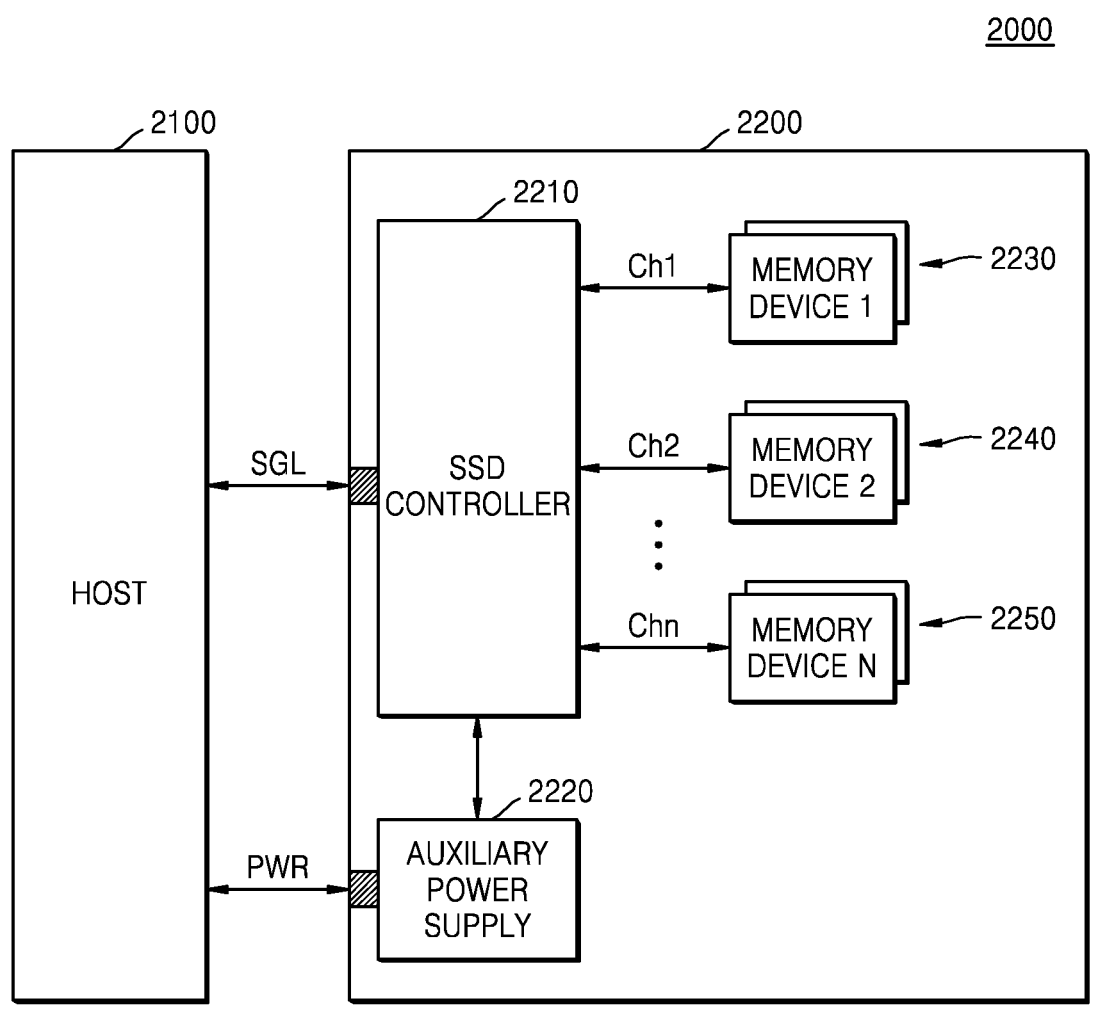
FIG. 23 is a block diagram for explaining a solid-state drive (SSD) system according to an exemplary embodiment of the inventive concept.

FIG. 23 is a block diagram for explaining a solid-state drive (SSD) system according to an exemplary embodiment of the inventive concept.

Referring to FIG. 23, an SSD system 2000 may include a host 2100 and an SSD 2200. The SSD 2200 may transmit or receive signals SGL to or from the host 2100 through a signal connector and may receive power PWR from the host 2100 through a power connector. The SSD 2200 may include an SSD controller 2210, an auxiliary power supply 2220, and a plurality of memory devices 2230, 2240, and 2250. The plurality of memory devices 2230, 2240, and 2250 may be vertical NAND flash memory devices. At least one of the plurality of memory devices 2230, 2240, and 2250 may be implemented to perform a read operation including the sensing operation, the dumping operation, and the like described above with reference to FIGS. 1 through 22. At least one of the plurality of memory devices 2230, 2240, and 2250 may be implemented using the non-volatile memory device 10 described above with reference to FIGS. 1 through 22, and may include the page buffer circuit 110. The functions and operations of the control logic unit 140 described above with reference to FIGS. 1 through 22 may be equally performed by at least one of the host 2100 and SSD controller 2210.

According to exemplary embodiments of the inventive concept described above with reference to FIGS. 1 through 22, data may be read from the cache latches included in the page buffer circuit 110 via the data I/O circuit 150, but data may also be read from the cache latches included in the page buffer circuit 110 and may be transmitted to a memory controller without passing through the data I/O circuit 150. In other words, data may be read from the cache latches included in the page buffer circuit 110.

According to an exemplary embodiment of the inventive concept, a dumping operation performed while data sensed from a page buffer is being output to a data I/O circuit is split and is performed in parallel with a data outputting operation, and thus a time period for dumping may be hidden by a data-outputting time period.

According to an exemplary embodiment of the inventive concept, when a random read operation is executed, a dumping time period may be reduced by dumping only a portion of the data sensed according to an address signal. Moreover, a sensing time period may be reduced by merging memory planes that are to perform sensing.

Therefore, according to exemplary embodiments of the inventive concept, reading performance may be increased by reducing a time period taken for a read operation.

While the inventive concept has been shown and described with reference to exemplary embodiments thereof, it will be understood by those of ordinary skill in the art that various changes in form and details may be made thereto without departing from the spirit and scope of the inventive concept as set forth by the appended claims.

What is claimed is:

1. A non-volatile memory device comprising:
a memory cell array comprising a plurality of memory cells;
a page buffer circuit comprising a plurality of first page buffers and a plurality of second page buffers, the plurality of first page buffers and the plurality of second page buffers each comprising a sense latch, a data latch, and a cache latch, wherein the sense latch is configured to sense data stored in the memory cell array and dump the sensed data to the data latch, the data latch is configured to dump the data dumped by the sense latch to the cache latch, and the cache latch is configured to transmit the data dumped by the data latch to a data input/output (I/O) circuit; and
a control logic circuit configured to:
control the page buffer circuit such that, while the cache latch included in at least one of the plurality of first page buffers is performing a data transmit operation, the data latch included in at least one of the plurality of second page buffers performs a data dumping operation;
control the plurality of first page buffers such that the data latch included in the at least one of the plurality of first page buffers dumps the data dumped by the sense latch included in the at least one of the plurality of first page buffers to the cache latch included in the at least one of the plurality of first page buffers; and
control the plurality of second page buffers such that the data latch included in the at least one of the plurality of second page buffers dumps the data dumped by the sense latch included in the at least one of the plurality of second page buffers to the cache latch included in the at least one of the plurality of second page buffers.

2. The non-volatile memory device of claim 1, wherein the control logic circuit is further configured to:
control the plurality of first page buffers such that, while the data latch included in the at least one of the plurality of second page buffers is dumping data, the cache latch included in the at least one of the plurality of first page buffers outputs data.

3. The non-volatile memory device of claim 1, wherein the memory cell array comprises a page including the plurality of memory cells connected to an identical word line,
the cache latch included in the at least one of the plurality of first page buffers outputs data based on a portion of data stored in the page, and
the cache latch included in the at least one of the plurality of second page buffers outputs data based on a remaining portion of data stored in the page.

4. The non-volatile memory device of claim 3, wherein the number of data bits output by the plurality of first page buffers is equal to the number of data bits output by the plurality of second page buffers.

5. The non-volatile memory device of claim 1, wherein the control logic circuit is further configured to control the page buffer circuit such that, while the data latch included in the at least one of the plurality of first page buffers is dumping data, the data latch included in the at least one of the plurality of second page buffers postpones dumping.

6. The non-volatile memory device of claim 1, wherein a time period taken for the cache latch included in the at least one of the plurality of first page buffers to transmit data to the data I/O circuit is longer than a time period taken for the data latch included in the at least one of the plurality of second page buffers to dump data.

7. The non-volatile memory device of claim 1, further comprising:
a first current path to which the data latch included in the at least one of the plurality of first page buffers and the sense latch included in the at least one of the plurality of first page buffers are electrically connected; and
a second current path to which the data latch included in the at least one of the plurality of first page buffers and the cache latch included in the at least one of the plurality of first page buffers are electrically connected,
wherein a distance of the first current path is shorter than a distance of the second current path.

8. A non-volatile memory device configured to perform a random read operation, the non-volatile memory device comprising:
a memory cell array comprising a page including memory cells connected to an identical word line;

a page buffer circuit comprising a first page buffer and a second page buffer, the first page buffer and the second page buffer each comprising a sense latch, a data latch, and a cache latch, wherein the sense latch is configured to sense data from the memory cell array and dump the sensed data, the data latch is configured to selectively dump the data dumped by the sense latch, and the cache latch is configured to transmit the data dumped by the data latch to a data input/output (I/O) circuit; and a control logic circuit configured to:
control the data latch of the first page buffer to dump first data to the cache latch of the first page buffer and control the data latch of the second page buffer not to dump second data to the cache latch of the second page buffer, in response to receiving a command and an address indicating the random read operation; and
identify memory cells storing data that is to be read to perform the random read operation, from among the memory cells included in the page, based on the address, and determine the data stored in the identified memory cells to be the first data.

9. The non-volatile memory device of claim 8, wherein the first data is based on data stored in some of the memory cells included in the page, and the second data is based on data stored in remaining memory cells included in the page.

10. The non-volatile memory device of claim 8, further comprising a plane comprising a plurality of pages,
wherein the page buffer circuit is configured to sense data from the plane, and
the control logic circuit is further configured to control the first page buffer and the second page buffer such that the first page buffer senses data stored in a first plane and the second page buffer senses data stored in a second plane.

11. The non-volatile memory device of claim 8, further comprising a plane comprising a plurality of pages,
wherein the control logic circuit is further configured to:
receive a first address and a second address, and
control the first page buffer and the second page buffer such that, if the first address and the second address indicate different planes, while the first page buffer is sensing data stored in a first plane, the second page buffer senses data stored in a second plane.

12. An operation method of a page buffer circuit that outputs data sensed from a plurality of bit lines to a data input/output (I/O) circuit, the operation method comprising:
sensing first data and second data from the plurality of bit lines by using a plurality of first sense latches and a plurality of second sense latches, respectively;
dumping the first data from the plurality of first sense latches to a plurality of first data latches, and dumping the second data from the plurality of second sense latches to a plurality of second data latches;
dumping the first data from the plurality of first data latches to a plurality of first cache latches;
maintaining the second data without dumping the second data during at least a portion of a time period during which the first data is being dumped to the plurality of first cache latches, wherein the maintaining of the second data is performed by the plurality of second data latches;
outputting the first data from the plurality of first cache latches; and
dumping the second data from the plurality of second data latches to a plurality of second cache latches while the first data is being output from the plurality of first cache latches.

13. The operation method of claim 12, wherein a time period taken for the plurality of second data latches to dump the second data to the plurality of second cache latches is shorter than a time period taken for the plurality of first cache latches to output the first data.

14. The operation method of claim 12, wherein
each of the first data and the second data comprises data stored in a memory cell of a first page, wherein the first data comprises a portion of the data stored in the first page, and the second data comprises a remaining portion of the data stored in the first page,
the dumping of the second data comprises dumping the second data while third data stored in a second page is being sensed from the plurality of bit lines, and
the first page and the second page are consecutive pages.

15. The operation method of claim 12, further comprising outputting the first data from the plurality of first cache latches to the data I/O circuit while the second data is being maintained, and not outputting the second data to the data I/O circuit.

16. The operation method of claim 15, further comprising identifying the data to be read by a random read operation as the first data based on a received address.

17. The operation method of claim 12, further comprising:
outputting the second data from the plurality of second cache latches; and
dumping n-th data from a plurality of n-th data latches to a plurality of n-th cache latches when the second data is entirely output from the plurality of second cache latches, wherein n is an integer greater than 2.

18. The operation method of claim 17, wherein a time period taken to dump data from the plurality of first data latches to the plurality of first cache latches, a time period taken to dump data from the plurality of second data latches to the plurality of second cache latches, a time period taken to output the first data from the plurality of first cache latches, and a time period taken to output the second data from the plurality of second cache latches are substantially the same as one another.

* * * * *